(12) United States Patent
Chuang et al.

(10) Patent No.: US 9,603,263 B2
(45) Date of Patent: Mar. 21, 2017

(54) MANUFACTURING METHOD OF CIRCUIT SUBSTRATE

(75) Inventors: Chih-Hong Chuang, Hsinchu (TW); Tzu-Wei Huang, Hsinchu (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 963 days.

(21) Appl. No.: 13/552,654

(22) Filed: Jul. 19, 2012

(65) Prior Publication Data

US 2012/0279630 A1 Nov. 8, 2012

Related U.S. Application Data

(62) Division of application No. 12/979,334, filed on Dec. 28, 2010, now abandoned.

(30) Foreign Application Priority Data

| Dec. 29, 2009 | (TW) | 98145638 A |
| Apr. 20, 2010 | (TW) | 99112313 A |
| Dec. 2, 2010 | (TW) | 99141954 A |

(51) Int. Cl.
H05K 3/00 (2006.01)
H05K 3/42 (2006.01)

(52) U.S. Cl.
CPC ........... *H05K 3/427* (2013.01); *H05K 3/0097* (2013.01); *H05K 2201/096* (2013.01); *H05K 2201/09509* (2013.01); *H05K 2203/0228* (2013.01); *H05K 2203/1536* (2013.01); *Y10T 29/49124* (2015.01); *Y10T 29/49126* (2015.01); *Y10T 29/49156* (2015.01)

(58) Field of Classification Search
CPC ............... H05K 3/0052; H05K 3/0097; Y10T 29/49126; Y10T 29/49155; Y10T 29/49156; Y10T 29/49165
See application file for complete search history.

(56) References Cited

U.S. PATENT DOCUMENTS

| 8,104,171 B2 * | 1/2012 | Appelt | H01L 21/486 156/182 |
| 8,609,997 B2 * | 12/2013 | Shomura | H05K 3/4602 174/260 |
| 2010/0147559 A1 * | 6/2010 | Kim | H05K 3/0097 174/250 |

* cited by examiner

*Primary Examiner* — Livius R Cazan
(74) *Attorney, Agent, or Firm* — Jianq Chyun IP Office

(57) ABSTRACT

A manufacturing method of a circuit substrate includes the following steps. The peripheries of two metal layers are bonded to form a sealed area. At least a through hole passing through the sealed area is formed. Two insulating layers are formed on the two metal layers. Two conductive layers are formed on the two insulating layers. The two insulating layers and the two conductive layers are laminated to the two metal layers bonded to each other, wherein the metal layers are embedded between the two insulating layers, and the two insulating layers fill into the through hole. The sealed area of the two metal layers is separated to form two separated circuit substrates. Therefore, the thinner substrate can be operated in the following steps, such as patterning process or plating process. In addition, the method may be extended to manufacture the circuit substrate with odd-numbered layer or even-numbered layer.

8 Claims, 24 Drawing Sheets

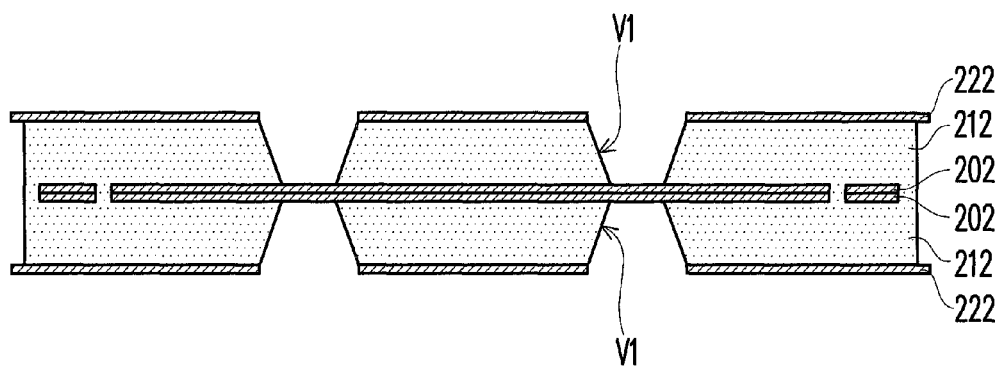
FIG. 2D"
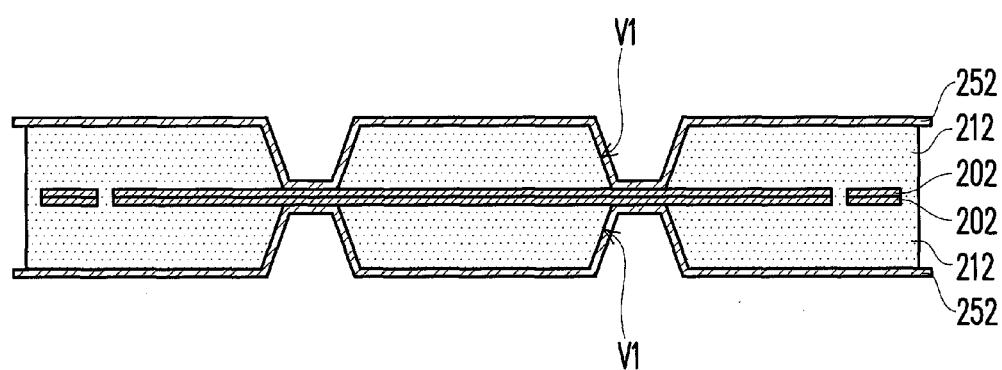
FIG. 2E"

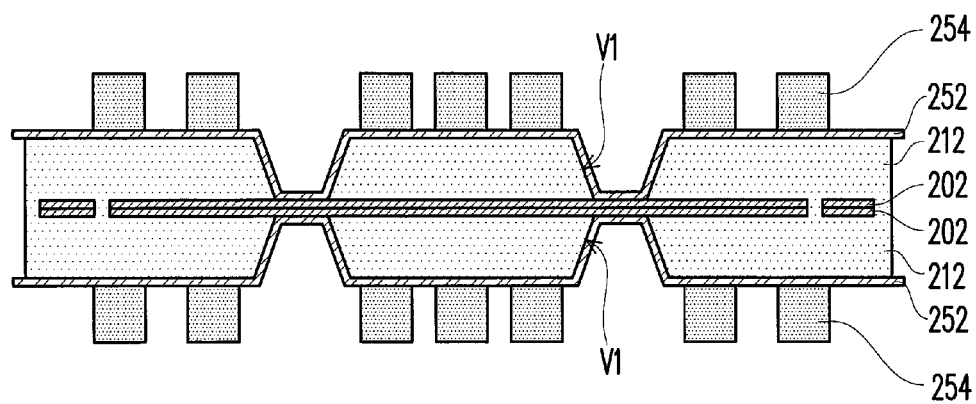
FIG. 2F"
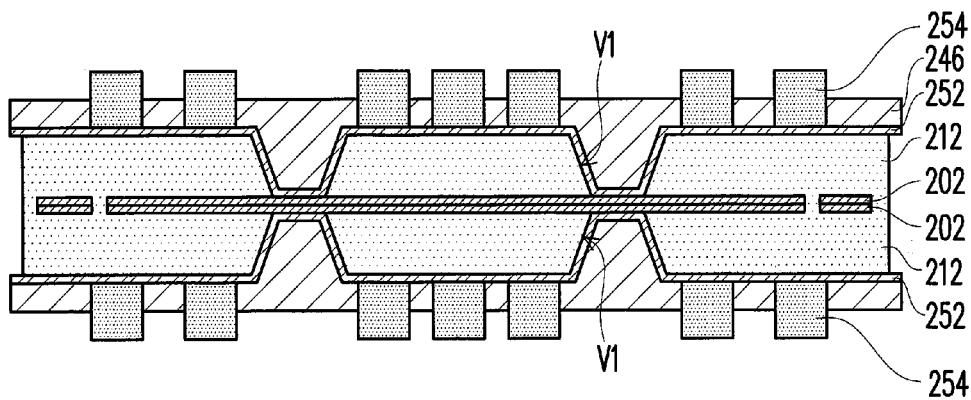
FIG. 2G"

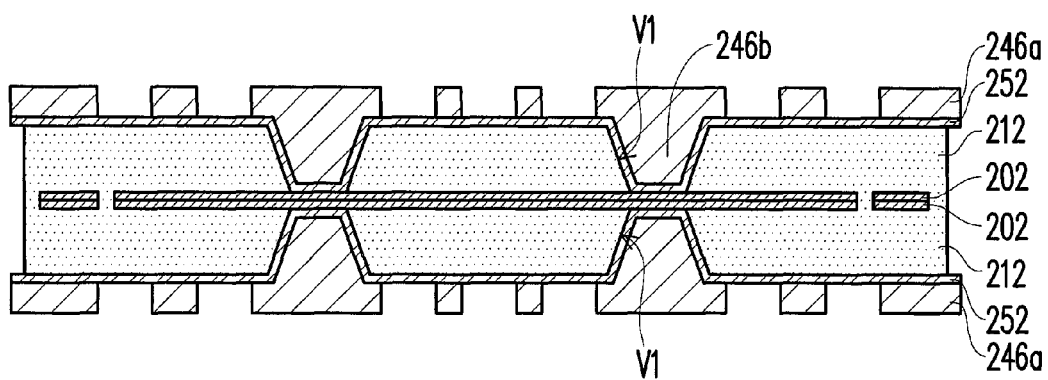
FIG. 2H"
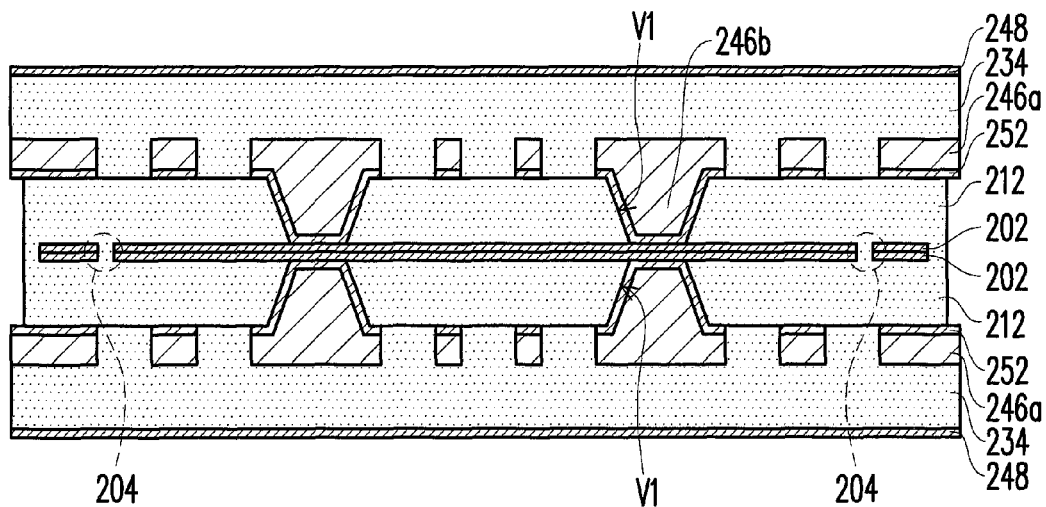
FIG. 2I"

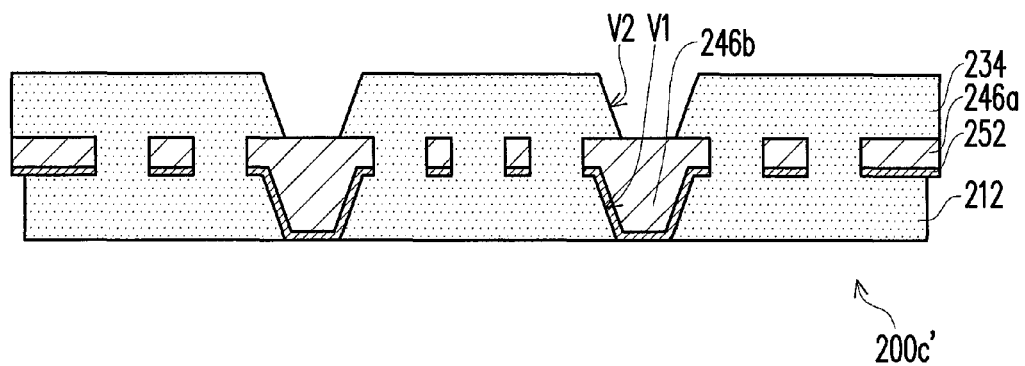
FIG. 2J"
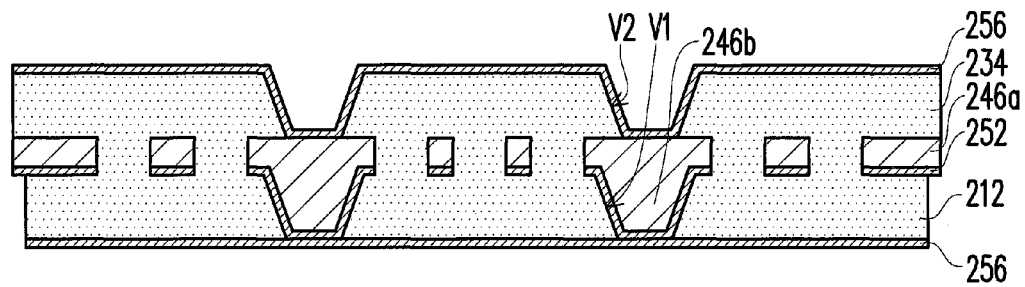
FIG. 2K"

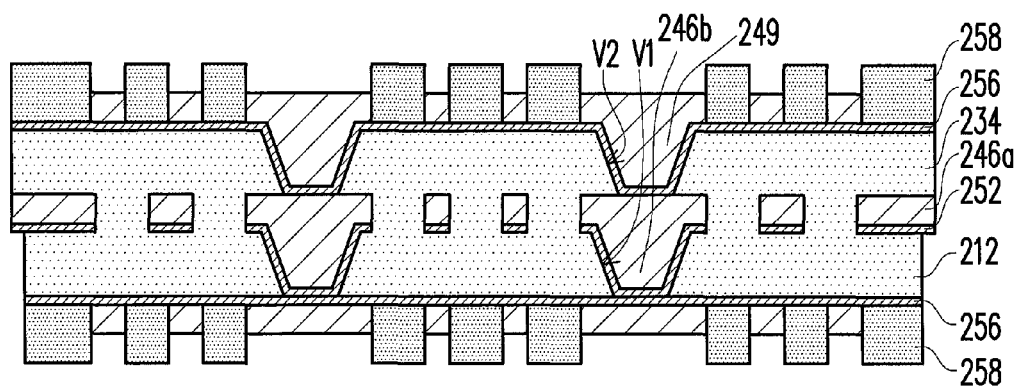
FIG. 2L"
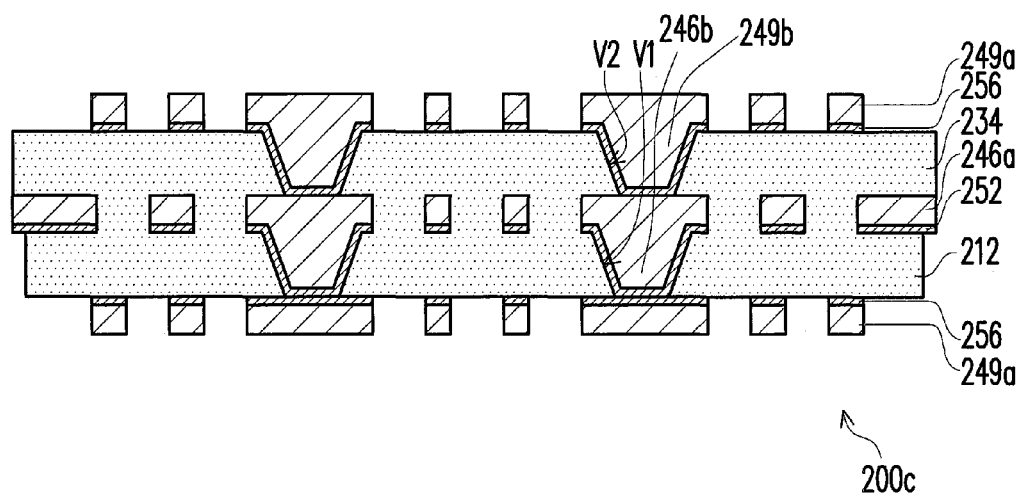
FIG. 2M"

MANUFACTURING METHOD OF CIRCUIT SUBSTRATE

CROSS-REFERENCE TO RELATED APPLICATION

This application is a divisional application of U.S. application Ser. No. 12/979,334 filed on Dec. 28, 2010, now abandoned, which claims the priority benefit of Taiwan application serial no. 98145638, filed on Dec. 29, 2009, Taiwan application serial no. 99112313, filed on Apr. 20, 2010, and Taiwan application serial no. 99141954, filed on Dec. 2, 2010. The entirety of each of the above-mentioned patent applications is hereby incorporated by reference herein and made a part of specification.

BACKGROUND

1. Field of the Invention

The invention relates to a circuit substrate and a manufacturing method thereof. Particularly, the invention relates to a coreless circuit substrate and a manufacturing method thereof.

2. Description of Related Art

In a current semiconductor manufacturing process, a chip package carrier is one of commonly used packaging components. The chip package carrier is, for example, a multi-layer circuit board, which is mainly formed by alternately stacking multiple circuit layers and a multiple dielectric layers, where the dielectric layer is disposed between any two adjacent circuit layers, and the circuit layers can be electrically connected to each other through plating through holes (PTHs) or conductive vias passing through the dielectric layers. Since the chip package carrier has advantages of fine circuit layout, compact assembly, and good performance, it becomes a mainstream of chip package structures.

Generally, a circuit structure of the multi-layer circuit board is fabricated according to a build up method or a laminated method, so as to achieve features of high circuit density and small wiring space. Since a super-thin substrate has inadequate rigidity, a substrate with a certain thickness has to be first provided to serve as a support carrier. Then, a large amount of adhesives is coated and multiple circuit layers and multiple dielectric layers are alternately arranged on two opposite surfaces of the substrate. Then, the adhesive is removed to separate the circuit layers, the dielectric layers from the substrate, so as to form two multi-layer circuit boards separated to each other. Moreover, when the PTH and the conductive via is about to be formed, after a dielectric layer is formed, a blind hole is first formed to expose the circuit layer under the dielectric layer. Then, a copper layer is electroplated in the blind hole and on the dielectric layer through an electroplating method, so as to form another circuit layer and the PTH or the conductive via.

Since the substrate with a certain thickness hast to be provided to serve as the support carrier of a copper foil layer according to the conventional technique, if a material of the substrate is a metal material, material cost thereof is relatively high, so that manufacturing cost of the multi-layer circuit board is increased. Moreover, a large amount of adhesive is required for fixing the copper foil layer and the substrate, so that the adhesive is hard to be removed, and a production yield cannot be improved. In addition, regarding the circuit layer formed through electroplating, copper thickness evenness thereof is poor, so that when the required thickness of the circuit layer is relatively thin, a thinning process (for example, an etching process) is required to reduce the thickness of the circuit layer. Therefore, not only the manufacturing steps of the multi-layer circuit board are increased, the production yield of the multi-layer circuit board is also reduced.

SUMMARY OF THE INVENTION

The invention is directed to a circuit substrate and a manufacturing method thereof, which can reduce manufacturing steps and production cost, and improve production yield to improve reliability of products.

The invention provides a manufacturing method of a circuit substrate, which includes following steps. Peripheries of two metal layers are bonded to form a sealed area. At least a through hole passing through the sealed area is formed. Two insulating layers are formed on the two metal layers. Two conductive layers are formed on the two insulating layers. The two insulating layers and the two conductive layers are laminated to the two metal layers, where the two metal layers bonded to each other are embedded between the two insulating layers, and the two insulating layers are filled into the through hole. The sealed area of the two metal layers is separated to form two separated circuit substrates.

In an embodiment of the invention, a method of bonding the peripheries of the two metal layers includes welding, spot welding or using an adhesive, where a material of the adhesive includes cyanoacrylate ester or polypropylene resin.

In an embodiment of the invention, the manufacturing method of the circuit substrate further includes following steps. After the two insulating layers and the two conductive layers are laminated to the two metal layers, a part of the two insulating layers and a part of the two conductive layers are removed to form a plurality of blind holes exposing the two metal layers. A conductive material is formed in the blind holes and on the remained two conductive layers. After the sealed area of the two metal layers is separated, the conductive material, the metal layer and the conductive layer are patterned.

In an embodiment of the invention, the manufacturing method of the circuit substrate further includes following steps. After the two insulating layers and the two conductive layers are laminated to the two metal layers, a part of the two insulating layers and a part of the two conductive layers are removed to form a plurality of blind holes exposing the two metal layers. The two conductive layers are thinned. Two electroplating seed layers are formed on the two thinned conductive layers and in the blind holes. After the sealed area of the two metal layers is separated, the metal layer is exposed. A patterned photoresist layer is formed on the electroplating seed layer and the exposed metal layer, respectively. The patterned photoresist layers are taken as a mask to electroplate the electroplating seed layers. The patterned photoresist layers and a part of the electroplating seed layers covered by the patterned photoresist layers are removed.

In an embodiment of the invention, the manufacturing method of the circuit substrate further includes following steps. After the two insulating layers and the two conductive layers are laminated to the two metal layers, the two conductive layers are patterned to form two patterned conductive layers. Two other insulating layers are formed on the two patterned conductive layers, and two other conductive layers are formed on the two other insulating layers. The insulating layers and the two other conductive layers are laminated, and the two patterned conductive layers are embedded in the insulating layers. After the sealed area of the two metal layers is separated, a part of the insulating layers, a part of the metal layer and a part of the other conductive layer are removed to form a plurality of blind holes exposing the patterned conductive layer. A conductive material is formed in the blind holes, and on the remained metal layer and the other conductive layer. The conductive material, the metal layer and the other conductive layer are patterned.

In an embodiment of the invention, the manufacturing method of the circuit substrate further includes following steps. After the two insulating layers and the two conductive layers are laminated to the two metal layers, the two conductive layers are patterned to form two patterned conductive layers. Two other insulating layers are formed on the two patterned conductive layers, and two other conductive layers are formed on the two other insulating layers. The insulating layers and the two other conductive layers are laminated, and the two patterned conductive layers are embedded in the insulating layers. After the sealed area of the two metal layers is separated, a part of the insulating layers, a part of the metal layer and a part of the other conductive layer are removed to form a plurality of blind holes exposing the patterned conductive layer. The other conductive layer and the metal layer are removed to expose the insulating layers. Two electroplating seed layers are formed on the insulating layers and in the blind holes. Two patterned photoresist layers are formed on the two electroplating seed layers. The patterned photoresist layers are taken as a mask to electroplate the electroplating seed layers. The patterned photoresist layers and a part of the electroplating seed layers covered by the patterned photoresist layers are removed.

In an embodiment of the invention, the manufacturing method of the circuit substrate further includes following steps. After the two insulating layers and the two conductive layers are laminated to the two metal layers, a part of the two insulating layers and a part of the two conductive layers are removed to form a plurality of first blind holes exposing the two metal layers. The two conductive layers are removed to expose the two insulating layers. Two electroplating seed layers are formed on the two insulating layers and in the first blind holes. Two patterned photoresist layers are formed on the electroplating seed layers. The patterned photoresist layers are taken as a mask to electroplate the electroplating seed layers. The patterned photoresist layers and a part of the electroplating seed layers covered by the patterned photoresist layers are removed to form two patterned conductive layers and a plurality of conductive through hole structures on the two insulating layers. Two other insulating layers are formed on the two patterned conductive layers, and two other conductive layers are formed on the two other insulating layers. The insulating layers and the two other conductive layers are laminated, and the two patterned conductive layers are embedded in the insulating layers. After the sealed area of the two metal layers is separated, a part of the insulating layers, the metal layer and the other conductive layer are removed to form a plurality of second blind holes exposing the patterned conductive layer. Two other electroplating seed layers are formed on the two other insulating layers, one ends of the first blind holes and in the second blind holes. Two other patterned photoresist layers are formed on the two other electroplating seed layers. The two other patterned photoresist layers are taken as a mask to electroplate the two other electroplating seed layers. The two other patterned photoresist layers and a part of the two other electroplating seed layers covered by the two other patterned photoresist layers are removed.

In an embodiment of the invention, the two metal layers respectively includes a first copper foil layer and a second copper foil layer, and a thickness of each of the second copper foil layers is substantially greater than a thickness of each of the first copper foil layers. The second copper foil layers are bonded to each other.

In an embodiment of the invention, the manufacturing method of the circuit substrate further includes following steps. After the two insulating layers and the two conductive layers are laminated to the two metal layers, the two conductive layers are patterned to from a first patterned conductive layer and a second patterned conductive layer. A plurality of first through holes extending from the first patterned conductive layer to the second patterned conductive layer is formed. After the sealed area of the two metal layers is separated, the second copper foil layer is removed. A first insulating layer is formed on the first patterned conductive layer, and a first conductive layer is formed on the first insulating layer. The first insulating layer and the first conductive layer are laminated, and the first patterned conductive layer is embedded in the insulating layer and the first insulating layer. A part of the insulating layer, the first insulating layer, a part of the first copper foil layer and a part of the first conductive layer are removed to form a plurality of first blind holes exposing the first patterned conductive layer. An electroplating seed layer is formed on the remained first copper foil layer and in the first blind holes and on the remained first conductive layer and in the first blind holes, respectively. Two patterned photoresist layers are formed on the electroplating seed layers. The patterned photoresist layers are taken as a mask to electroplate the electroplating seed layers to form a plurality of conductive blind hole structures in the first blind holes. The patterned photoresist layers and a part of the electroplating seed layers covered by the patterned photoresist layers are removed.

In an embodiment of the invention, the first insulating layer is formed on the first patterned conductive layer and the first conductive layer is formed on the first insulating layer after the sealed area of the two metal layers is separated.

In an embodiment of the invention, the first insulating layer is formed on the first patterned conductive layer and the first conductive layer is formed on the first insulating layer before the sealed area of the two metal layers is separated.

In an embodiment of the invention, the manufacturing method of the circuit substrate further includes following steps. When the first insulating layer is formed on the first patterned conductive layer and the first conductive layer is formed on the first insulating layer, a second insulating layer is formed on the second patterned conductive layer and a second conductive layer is formed on the second insulating layer.

In an embodiment of the invention, the manufacturing method of the circuit substrate further includes following steps. After the patterned photoresist layers and a part of the electroplating seed layers covered by the patterned photoresist layers are removed, a first passivation layer is formed on the first insulating layer, and a second passivation layer is formed on the insulating layer, where the first passivation layer and the second passivation layer cover the conductive blind hole structures. A grinding process is performed to remove a part of the first passivation layer and a part of the second passivation layer to expose the conductive blind hole structures. The remained first passivation layer and the remained second passivation layer are removed.

In an embodiment of the invention, the manufacturing method of the circuit substrate further includes following steps. After the patterned photoresist layers and a part of the electroplating seed layers covered by the patterned photoresist layers are removed, a first solder mask layer is formed on the first insulating layer, and a second solder mask layer is formed on the insulating layer, where the first solder mask layer has a plurality of first openings, and the second solder mask layer has a plurality of second openings, and the first openings and the second openings expose a part of the conductive blind hole structure.

The invention provides a circuit substrate including a patterned metal layer, a patterned conductive layer, an insulating layer and a conductive material. The insulating layer is located between the patterned metal layer and the patterned conductive layer. The conductive material is filled in a plurality of blind holes, where the blind holes pass through the insulating layer, and the conductive material is electrically connected to the patterned metal layer and the patterned conductive layer.

The invention provides a circuit substrate including a patterned metal layer, a first patterned conductive layer, a second patterned conductive layer, two insulating layers and a conductive material. The second partnered conductive layer is located between the patterned metal layer and the first patterned conductive layer. The insulating layers are respectively located between the patterned metal layer and the second patterned conductive layer and between the first patterned conductive layer and the second patterned conductive layer. The conductive material is filled in a plurality of blind holes, where the blind holes pass through the insulating layers, and the conductive material is electrically connected between the patterned metal layer and the second patterned conductive layer and between the first patterned conductive layer and the second patterned conductive layer.

According to the above descriptions, in the invention, the peripheries of two metal layers are first bonded to form a sealed area. After lamination of two insulating layers and two conductive layers is completed, the two metal layers are separated. Therefore, compared to the conventional technique, the manufacturing method of the circuit substrate of the invention does not require a metal substrate to serve as a support carrier, namely, a coreless circuit substrate structure is achieved, which may effectively reduce the manufacturing cost of the circuit substrate and improve reliability thereof, and effectively reduce a time required for manufacturing the circuit substrate.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 1E and FIG. 1F' to FIG. 1J' are cross-sectional views illustrating a manufacturing method of a circuit substrate according to another embodiment of the invention.

FIG. 2A to FIG. 2G and FIG. 2H' to FIG. 2K' are cross-sectional views illustrating a manufacturing method of a circuit substrate according to another embodiment of the invention.

FIG. 2A to FIG. 2C and FIG. 2D" to FIG. 2M" are cross-sectional views illustrating a manufacturing method of a circuit substrate according to another embodiment of the invention.

DETAILED DESCRIPTION OF DISCLOSED EMBODIMENTS

Figure 1A:
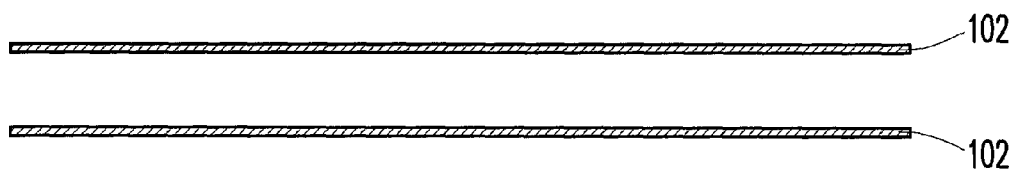
FIG. 1A to FIG. 1H are cross-sectional views illustrating a manufacturing method of a circuit substrate according to an embodiment of the invention.
Figure 1B:

FIG. 1A to FIG. 1H are cross-sectional views illustrating a manufacturing method of a circuit substrate according to an embodiment of the invention. Referring to FIG. 1A and FIG. 1B, the manufacturing method of the circuit substrate can be described as follow. First, two metal layers 102 are provided, where the two metal layers 102 are, for example, copper foils or other metal foils, and peripheries of the two metal layers 102 are bonded to form a sealed area 104. In the present embodiment, a method of bonding the peripheries of the two metal layers 102 includes welding or spot welding, so that the two metal layers 102 are temporarily bonded to avoid reagents used in follow-up processes from infiltrating there between. Certainly, besides the welding or spot welding, an adhesive can also be used to temporarily bond the peripheries of the two metal layers 102, where a material of the adhesive includes cyanoacrylate ester or polypropylene resin, or other adhesives. It should be noticed that the metal layers 102 can be regarded as a coreless structure layer.

Moreover, referring to FIG. 1B, in the present embodiment, after the peripheries of the metal layers 102 are bonded, at least a through hole H passing through the sealed area 104 is formed (only two through holes are schematically illustrated in FIG. 1B). A method of forming the through holes H includes laser drilling or mechanical drilling. Since a diameter of the through hole H is smaller than a size of the sealed area 104, tightness of the sealed area 104 is not spoiled by theses through holes H.

Figure 1C:
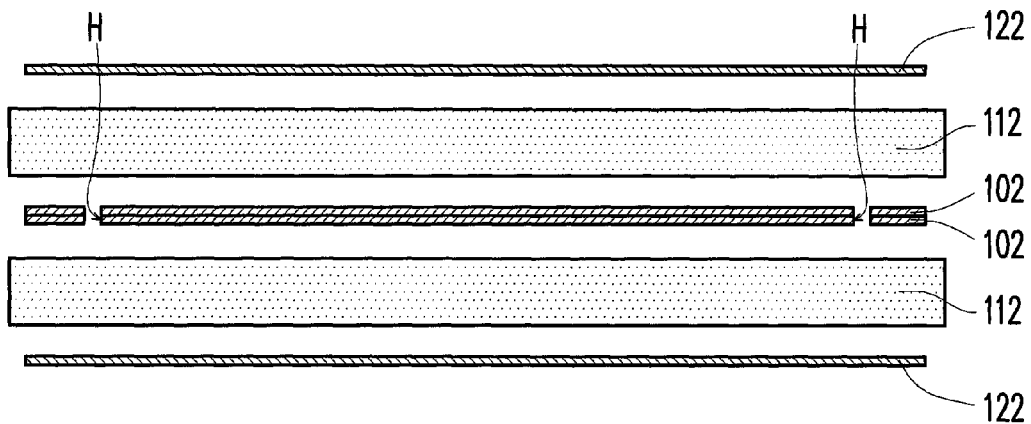
Figure 1D:
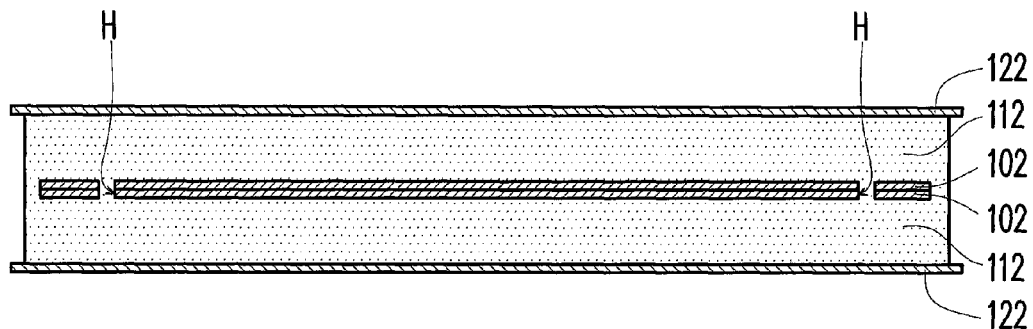

Then, referring to FIG. 1C and FIG. 1D, two insulating layers 112 are formed on the metal layers 102, and two conductive layers 122 are formed on the insulating layers 112, and then the insulating layers 112 and the conductive layers 122 are laminated, so that the metal layers 102 bonded to each other are embedded between the insulating layers 112. Meanwhile, the insulating layers 112 are filled into the through holes H of the sealed area 104 during the lamination. Since sizes of the insulating layers 112 are greater than sizes of the metal layers 102, the metal layers 102 can be entirely encapsulated in the insulating layers 112 without being contaminated by external impurities or reagents.

Figure 1E:
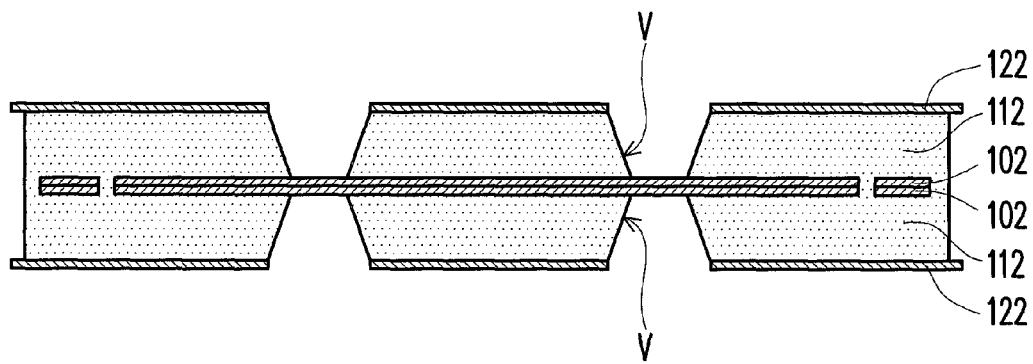

Then, referring to FIG. 1E, a part of the insulating layers 112 and a part of the conductive layers 122 are removed to form a plurality of blind holes V exposing the metal layers 102. In the present embodiment, a method of forming the blind holes V includes laser drilling, and a method of removing the conductive layers 122 includes laser etching or photolithography etching, etc.

Figure 1F:
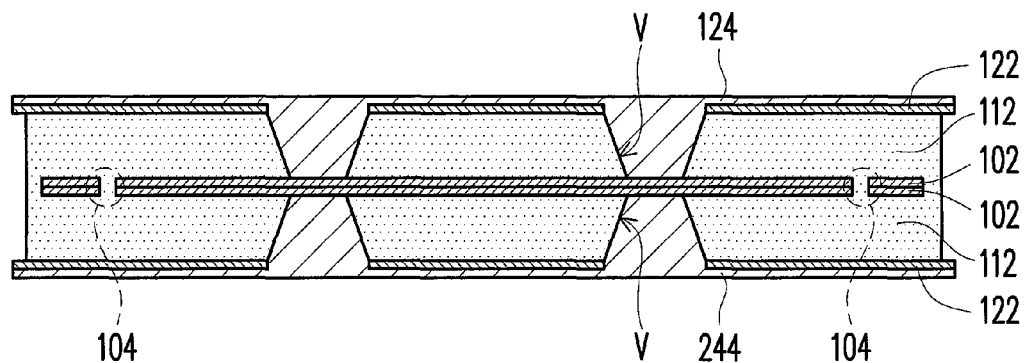

Then, referring to FIG. 1F, a conductive material 124 is formed in the blind holes V and on the remained conductive layers 122, where a method of forming the conductive material 124 includes electroplating, and the conductive material 124 is, for example, copper or other metals. It should be noticed that since the metal layers 102 can be entirely encapsulated in the insulating layers 112 without being contaminated by external impurities or reagents, when the conductive material 124 is formed in the blind holes V and on the remained conductive layers 122 through electroplating, the original size and thickness of the metal layers 102 embedded in the insulating layers 112 are not influenced.

Figure 1G:
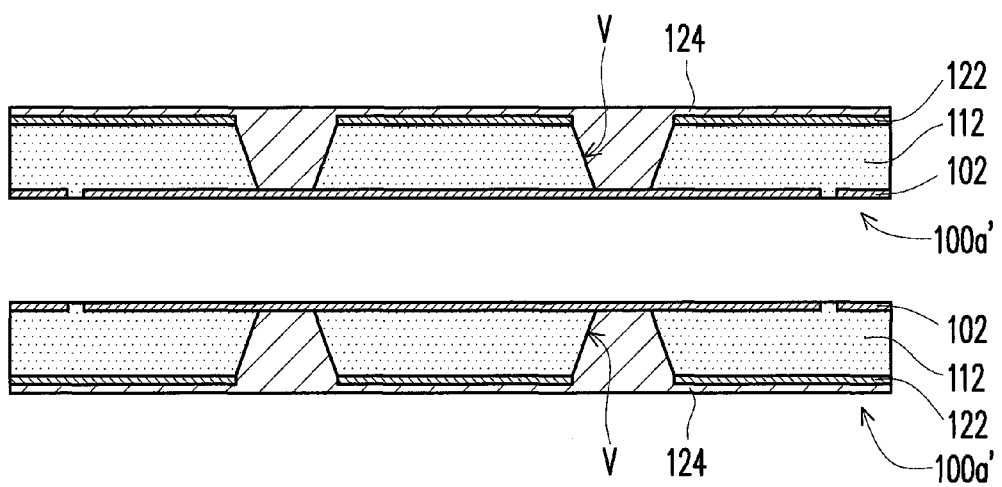

Then, referring to FIG. 1F and FIG. 1G, the sealed area 104 of the metal layers 102 is separated to form two separated circuit substrates 100a'. In the present embodiment, a forming machine or other tools can be used to remove the sealed area 104 encapsulated the metal layers 102 while taking the through holes H as reference points, so as to totally separate the metal layers 102. Certainly, the method of separating the metal layers 102 is not limited to the above method.

Figure 1H:
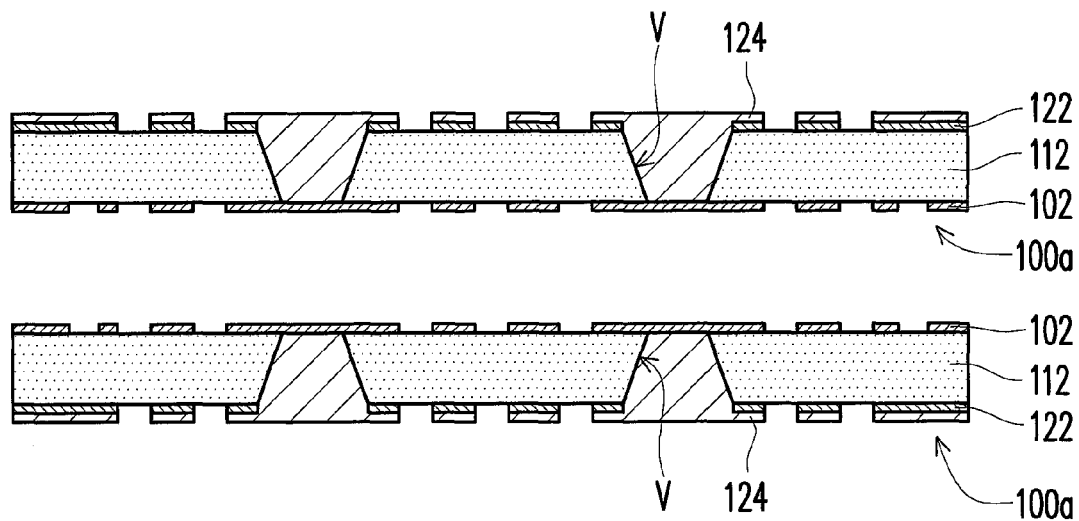
Figure 1F:
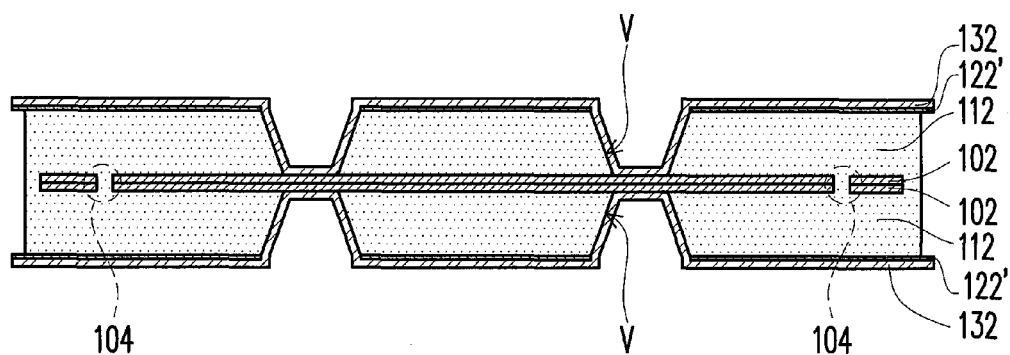
Figure 1G:
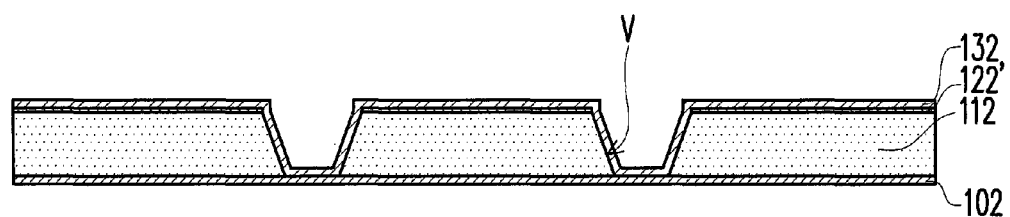
Figure 1H:
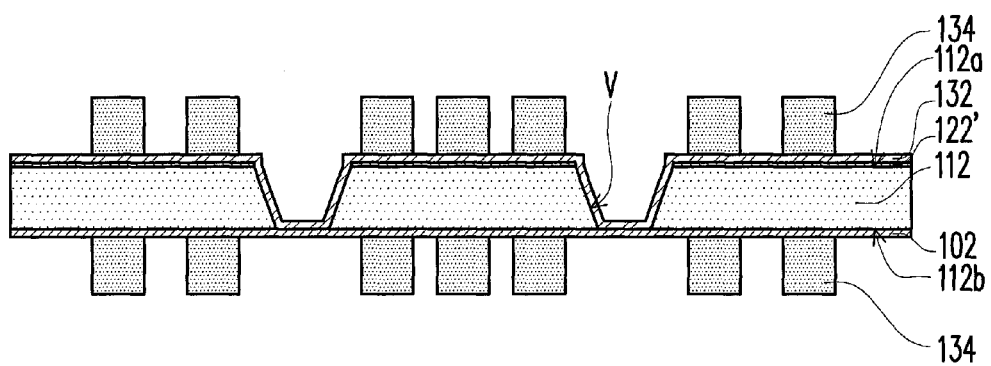

Then, referring to FIG. 1H, the conductive material 124, the metal layers 102 and the conductive layers 122 are patterned to form required patterns on the respective circuit substrates 100a', so as to form two circuit substrate 100a. In brief, in the present embodiment, each of the circuit substrates 100a includes a patterned metal layer 102, a patterned conductive layer 122, an insulating layer 112 and a conductive material 124, where the insulating layer 112 is located between the patterned metal layer 102 and the patterned conductive layer 122. The conductive material 124 is located in the blind holes V, where the blind holes V pass through the insulating layer 112, so that the conductive material 124 is electrically connected to the patterned metal layer 102 and the patterned conductive layer 122. Now, fabrication of the cureless circuit substrate 100a is completed.

It should be noticed that reference numbers of the components and a part of contents of the aforementioned embodiment are also used in the following embodiment, where the same reference numbers denote the same or like components, and descriptions of the same technical contents are omitted. The aforementioned embodiment can be referred for descriptions of the omitted parts, so that detailed descriptions thereof are not repeated in the following embodiment.

Figure 1I:
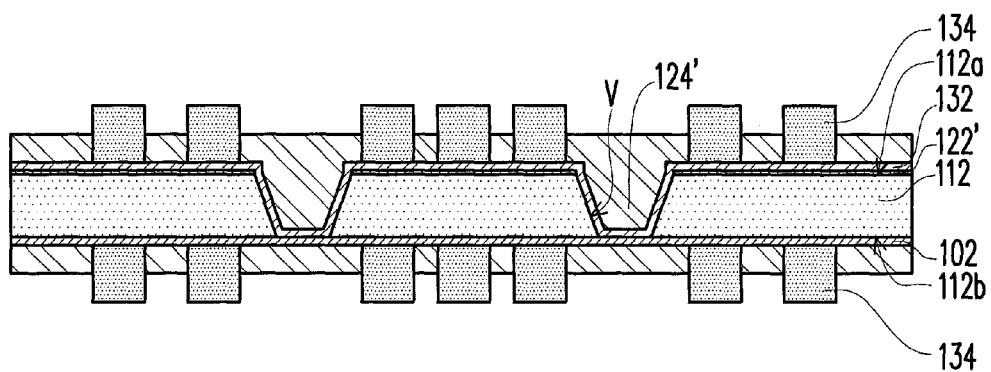
Figure 1J:
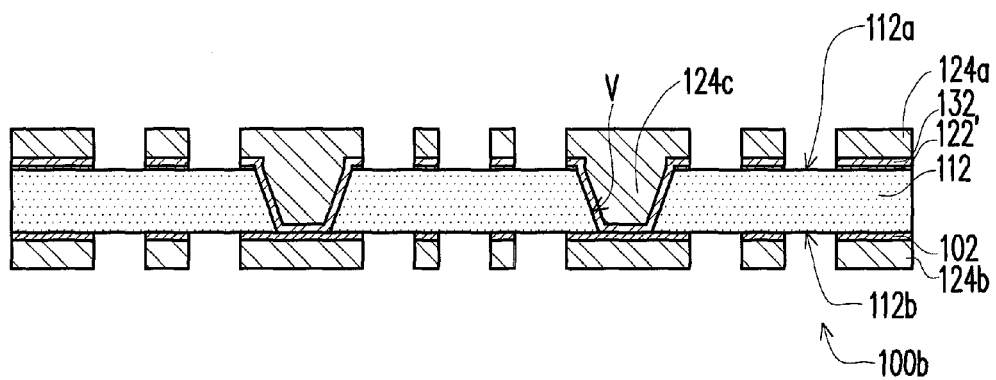

FIG. 1A to FIG. 1E and FIG. 1F' to FIG. 1J' are cross-sectional views illustrating a manufacturing method of a circuit substrate according to another embodiment of the invention. The manufacturing method of the circuit substrate 100b of the present embodiment is similar to the manufacturing method of the circuit substrate 100a, and differences there between are as follows. After the step of FIG. 1E, namely, a part of the insulating layers 112 and a part of the conductive layers 122 are removed to form a plurality of the blind holes V exposing the metal layers 102, referring to FIG. 1E and FIG. 1F', the conductive layers 122 are thinned to form a plurality of conductive layers 122', and two electroplating seed layers 132 are formed on the conductive layers 122' and in the blind holes V, where the electroplating seed layers 132 totally encapsulate the conductive layers 122' and inner walls of the blind holes V and a part of the metal layers 102. Then, referring to FIG. 1G', the sealed area 104 of the metal layers 102 is separated to expose the metal layer 102. Then, referring to FIG. 1H', a patterned photoresist layer 134 is formed on the electroplating layer 132 and the exposed metal layer 102, respectively. Then, referring to FIG. 1I', the patterned photoresist layers 134 are taken as a mask to electroplate the electroplating seed layer 132 and the metal layer 102 to form a conductive material 124'. Finally, referring to FIG. 1J', the patterned photoresist layers 134 and a part of the electroplating seed layer 132 covered by the patterned photoresist layers 134 and a part of the metal layer 102 covered by the patterned photoresist layers 134 are removed to expose a part of an upper surface 112a and a part of a lower surface 112b of the insulating layer 112, so as to form a first patterned conductive material layer 124a, a second patterned conductive material layer 124b and a conductive blind hole structure 124c, where the conductive blind hole structure 124c is electrically connected to the first patterned conductive material layer 124a and the second patterned conductive material layer 124b. Now, fabrication of the circuit substrate 100b is completed.

In the above embodiments, circuit substrates 100a and 100b of two layers are formed, though in another embodiment, the circuit substrates 100a and 100b of two layers can be used as core layers to sequentially fabricate circuit substrates of four layers, six layers or more than six layers, and manufacturing methods thereof are the same to the manufacturing method of the general circuit substrate, which are not repeated herein. Moreover, in order to manufacture the circuit substrates of odd-numbered layers, the invention provides another manufacturing method of the circuit substrate.

Figure 2A:
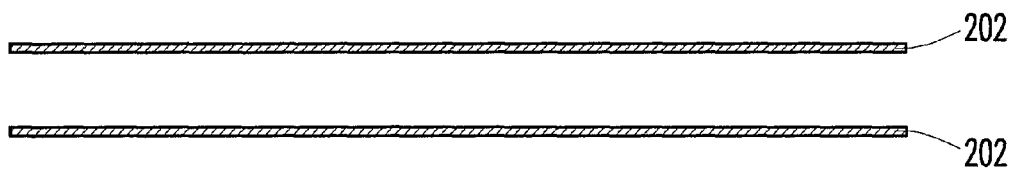
FIG. 2A to FIG. 2I are cross-sectional views illustrating a manufacturing method of a circuit substrate according to another embodiment of the invention.
Figure 2B:
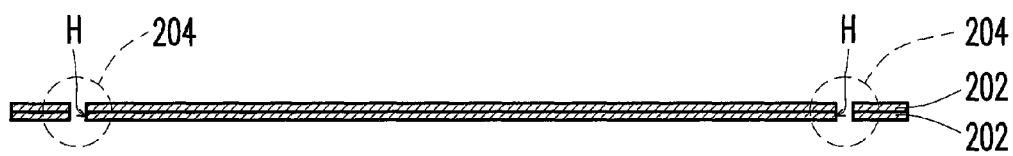

FIG. 2A to FIG. 2I are cross-sectional views illustrating a manufacturing method of a circuit substrate according to another embodiment of the invention. Referring to FIG. 2A and FIG. 2B, according to the manufacturing method of the circuit substrate, first, two metal layers 202 are provided, which are, for example, copper foils or other metal foils, and the peripheries of the metal layers 202 are bonded to form a sealed area 204, where a method of bonding the peripheries of the metal layers 202 includes welding or spot welding, so that the metal layers 202 are temporarily bonded to avoid reagents used in follow-up processes from infiltrating there between. Certainly, besides the welding or spot welding, an adhesive can also be used to temporarily bond the peripheries of the metal layers 202, where a material of the adhesive includes cyanoacrylate ester or polypropylene resin, or other adhesives. It should be noticed that the metal layers 202 can be regarded as a coreless structure layer.

Referring to FIG. 2B, in the present embodiment, after the peripheries of the metal layers 202 are bonded, at least a through hole H passing through the sealed area 204 is formed (only two through holes are schematically illustrated in FIG. 2B). A method of forming the through holes H includes laser drilling or mechanical drilling.

Figure 2C:
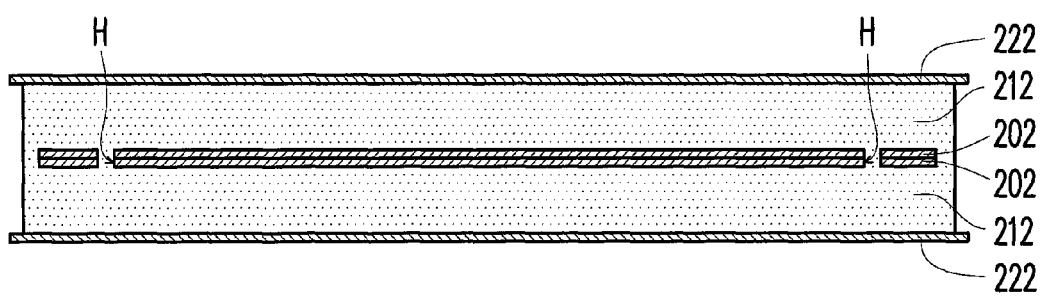
Figure 2D:
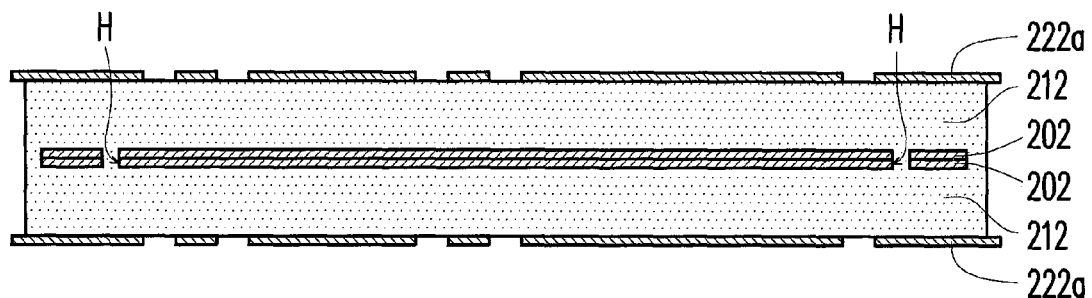
Figure 2E:
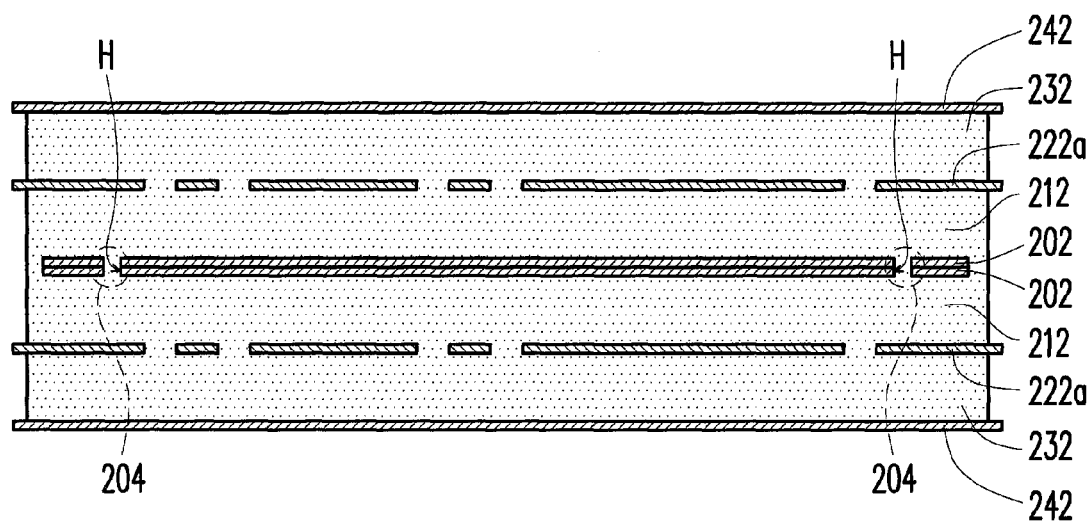

Then, referring to FIG. 2C to FIG. 2E, two insulating layers 212 are formed on the metal layers 202, and two conductive layers 222 are formed on the insulating layers 212. The two conductive layers 222 can be patterned to form two patterned conductive layers 222a in case that the metal layers 202 are in the sealed state. Then, two other insulating layers 232 are formed on the patterned conductive layers 222a, and two other conductive layers 242 are formed on the insulating layers 232. In FIG. 2C, the insulating layers 212 and the conductive layers 222 are laminated, so that the metal layers 202 bonded to each other are embedded in the insulating layers 212. Moreover, in FIG. 2E, the insulating layers 232 and 212 and the conductive layers 242 are laminated, so that the patterned conductive layers 222a are embedded in the insulating layers 232 and 212. Meanwhile, when the insulating layers 212 are laminated, the insulating layers 212 can be filled in the through holes H of the sealed area 204. Since sizes of the insulating layers 212 are greater than sizes of the metal layers 202, the metal layers 202 can be totally encapsulated in the insulating layers 212 without being contaminated by external impurities or reagents.

Figure 2F:
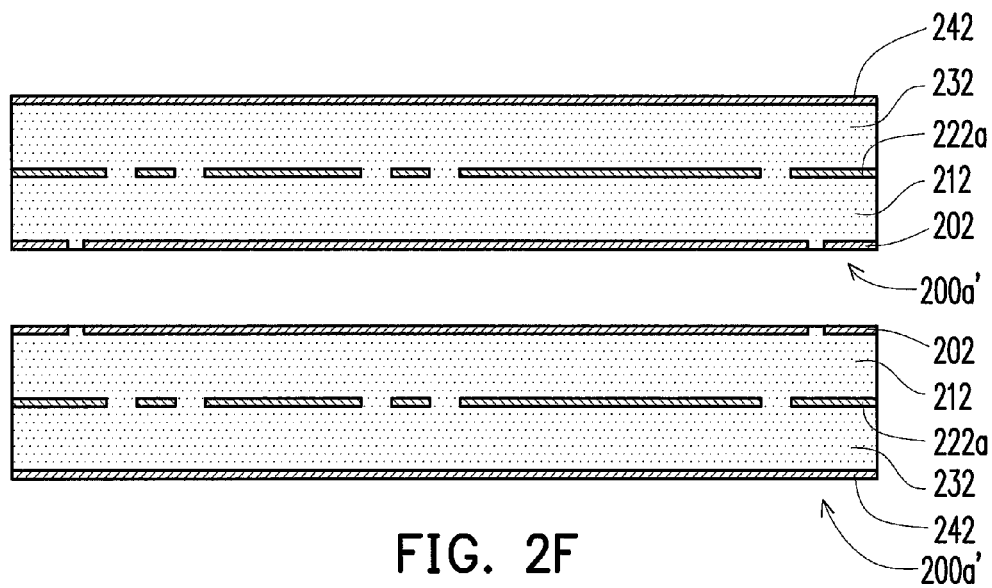

Then, referring to FIG. 2F, the sealed area 204 of the two metal layers 202 is separated to form two separated circuit substrates 200a'. Here, the circuit substrates 200a' respectively have three layers of circuit. In the present embodiment, a forming machine or other tools can be used to remove the sealed area 204 encapsulating the metal layers 202 while taking the through holes H (referring to FIG. 2E) as reference points, so as to totally separate the metal layers 202. Certainly, the method of separating the metal layers 202 is not limited to the above method.

Figure 2G:
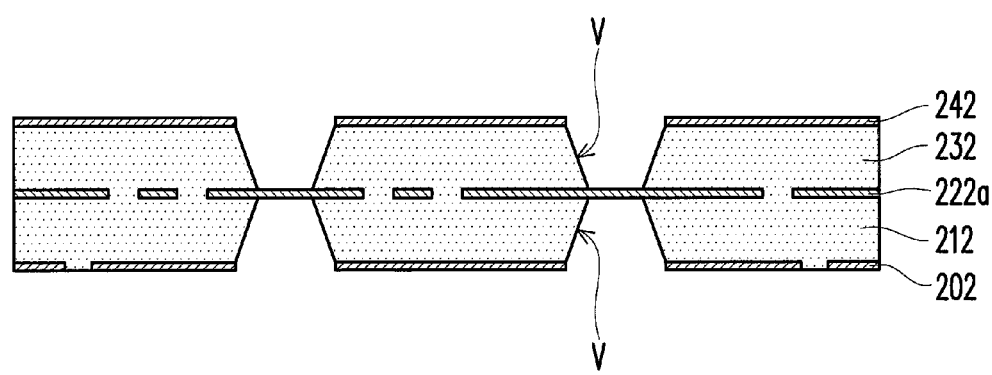
Figure 2H:
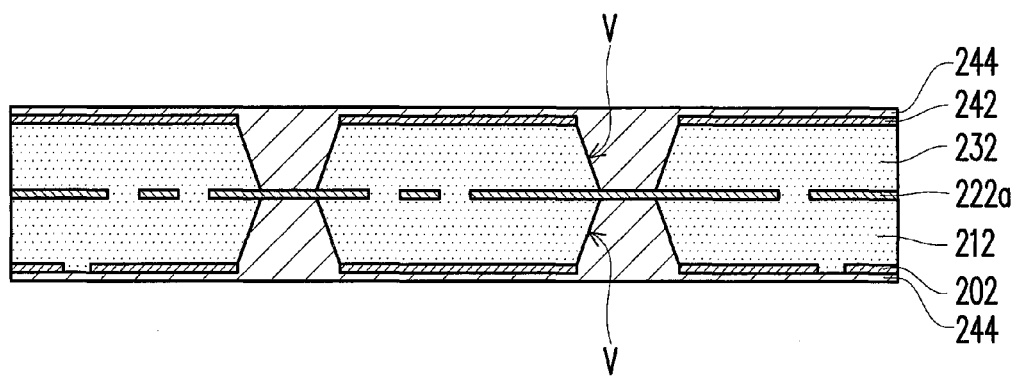

Then, referring to FIG. 2G, in which only one circuit substrate 200a' is illustrated. A part of the insulating layers 212 and 232, a part of the metal layer 202 and a part of the conductive layer 242 are removed to form a plurality of blind holes V exposing the patterned conductive layer 222a, where a method of forming the blind holes V includes laser drilling. Then, referring to FIG. 2H, a conductive material 224 is formed in the blind holes V, and on the remained metal layer 202 and the conductive layer 242, where a method of forming the conductive material 244 includes electroplating, and the conductive material 244 is, for example, copper or other metals. Finally, referring to FIG. 2I, the patterned conductive material 244, the metal layer 202 and the conductive layer 242 are patterned to form required circuits on the respective circuit substrate 200a', so as to complete fabricating the circuit substrate 200a.

Figure 2I:
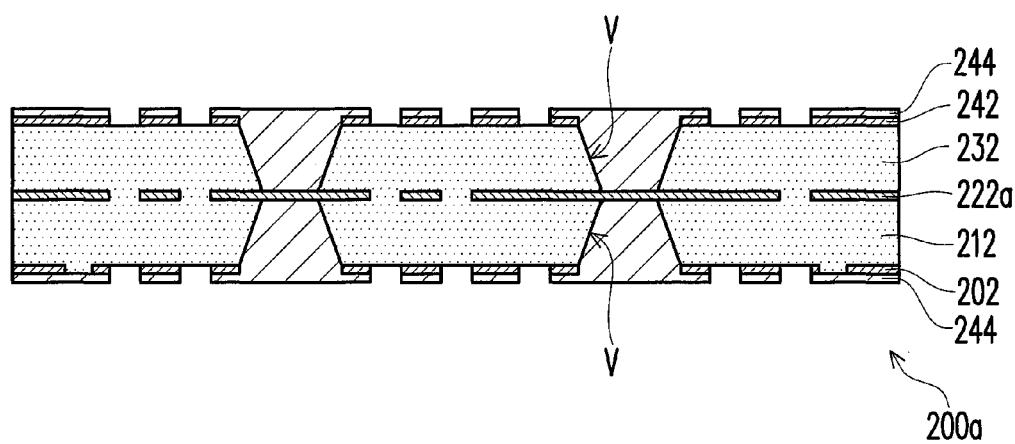
Figure 2H:
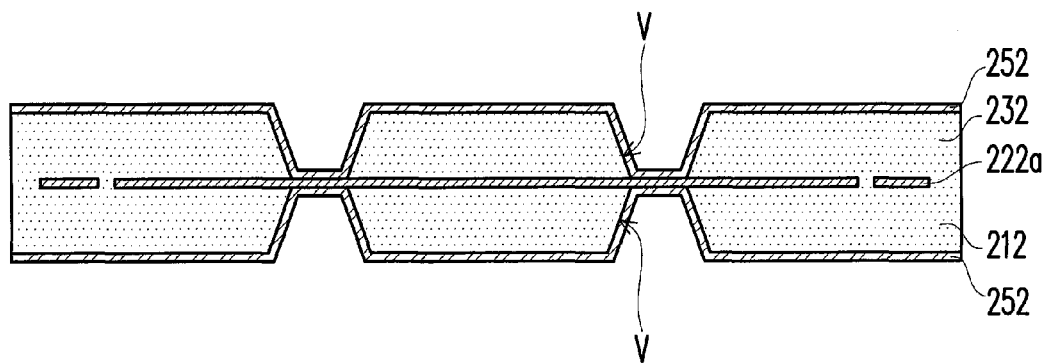
Figure 2I:
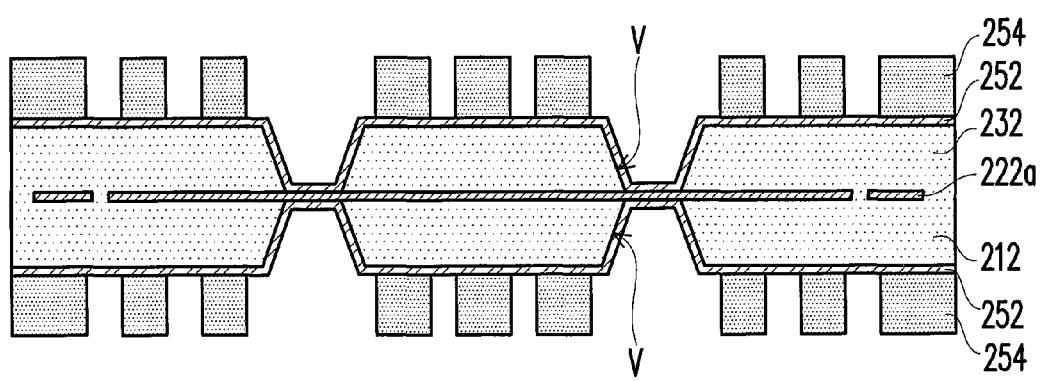

In brief, the circuit substrate 200a' having three layers of circuit shown in FIG. 2I includes a patterned metal layer 202, a patterned conductive layer 242, a patterned conductive layer 222a, two insulating layers 212 and 232, and a conductive material 244. The patterned conductive layer 222a is located between the patterned metal layer 202 and the patterned conductive layer 242. The insulating layers 212 and 232 are respectively located between the patterned metal layer 202 and the patterned conductive layer 222a and between the patterned conductive layer 242 and the patterned conductive layer 222a. The conductive material 244 is located in the blind holes V, and the blind holes V pass through the insulating layers 212 and 232, so that the conductive material 244 is electrically connected between the patterned metal layer 202 and the patterned conductive layer 222a, and between the patterned conductive layer 242 and the patterned conductive layer 222a.

Figure 2J:
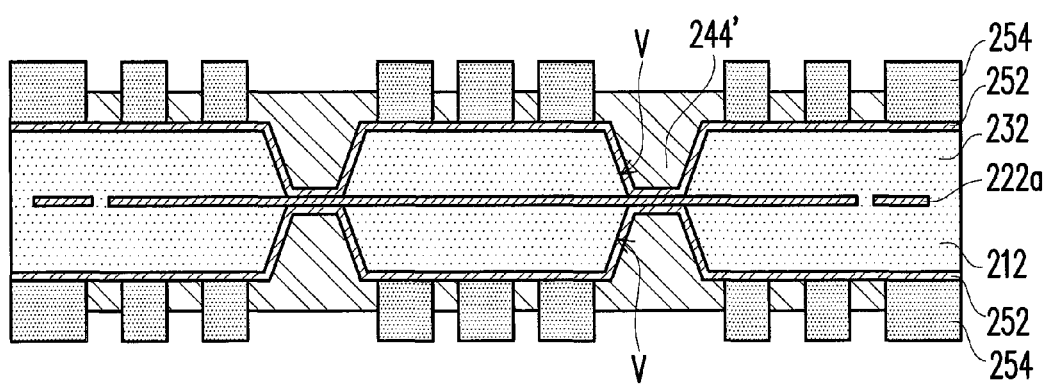
Figure 2K:
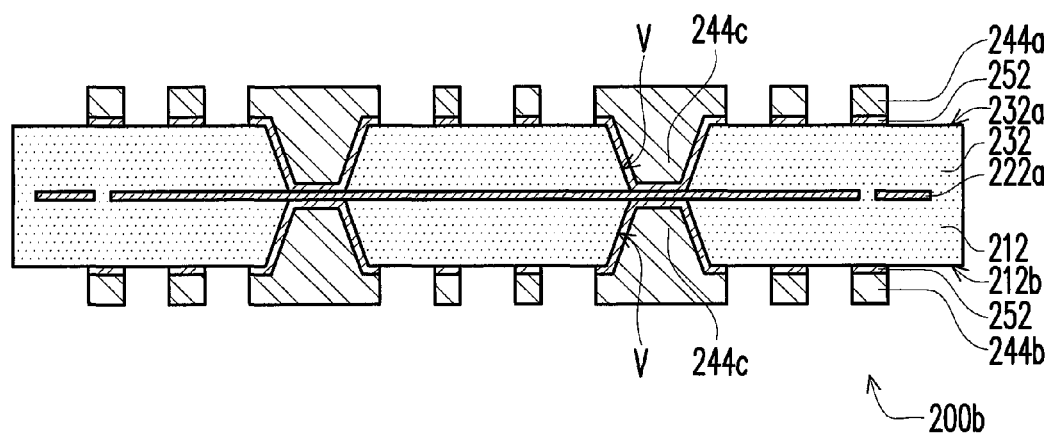

FIG. 2A to FIG. 2G and FIG. 2H' to FIG. 2K' are cross-sectional views illustrating a manufacturing method of a circuit substrate according to another embodiment of the invention. The manufacturing method of the circuit substrate 200b of the present embodiment is similar to the manufacturing method of the circuit substrate 200a, and differences there between are as follows. After the step of FIG. 2G, namely, a part of the insulating layers 212 and 232, a part of the metal layer 202 and a part of the conductive layer 242 are removed to form a plurality of the blind holes V exposing the patterned conductive layer 222a, referring to FIG. 2H', the conductive layer 242 and the metal layer 202 are removed to expose the insulating layers 232 and 212, and two electroplating seed layers 252 are formed on the insulating layers 212 and 232 and in the blind holes V. Then, referring to FIG. 2I', two patterned photoresist layers 254 are formed on the electroplating seed layers 252. Then, referring to FIG. 2J', the patterned photoresist layers 254 are taken as a mask to electroplate the electroplating seed layers 252 to form a conductive material 244'. Finally, referring to FIG. 2K', the patterned photoresist layers 254 and a part of the electroplating seed layers 252 covered by the patterned photoresist layers 254 are removed to expose a part of an upper surface 232a of the insulating layer 232 and a part of a lower surface 212b of the insulating layer 212, so as to form a first patterned conductive material layer 244a, a second patterned conductive material layer 244b and a plurality of conductive blind hole structures 244c, where the blind hole structures 244c are electrically connected between the first patterned conductive material layer 244a and the patterned conductive layer 222a and between the patterned conductive layer 222a and the second patterned conductive layer 244b. Now, fabrication of the circuit substrate 200b is completed.

FIG. 2A to FIG. 2C and FIG. 2D" to FIG. 2M" are cross-sectional views illustrating a manufacturing method of a circuit substrate according to another embodiment of the invention. The manufacturing method of the circuit substrate 200c of the present embodiment is similar to the manufacturing method of the circuit substrate 200a, and differences there between are as follows. After the step of FIG. 2C, namely, after the insulating layers 212 and the conductive layers 222 are laminated to the metal layers 202, referring to FIG. 2D", a part of the insulating layers 212 and a part of the conductive layers 222 are removed to form a plurality of first blind holes V1 exposing the metal layers 202. Then, referring to FIG. 2E", the conductive layers 222 are removed to expose the insulating layers 212, and two electroplating seed layers 252 are formed on the insulating layers 212 and in the first blind holes V1. Then, referring to FIG. 2F", two patterned photoresist layers 254 are formed on the electroplating seed layers 252. Then, referring to FIG. 2G", the patterned photoresist layers 254 are taken as a mask to electroplate the electroplating seed layers 252 to form a conductive material 246. Then, referring to FIG. 2H", the patterned photoresist layers 254 and a part of the electroplating seed layers 252 covered by the patterned photoresist layers 254 are removed to form two patterned conductive material layers 246a and a plurality of conductive through hole structures 246b on the electroplating seed layers 252.

Then, referring to FIG. 2I", two other insulating layers 234 are formed on the patterned conductive layers 246a, and two other conductive layers 248 are formed on the insulating layers 234. Then, the insulating layers 234 and the conductive layers 248 are laminated, and the patterned conductive layers 246a are embedded in the insulating layers 212 and 234. Then, referring to FIG. 2J", the sealed area 204 of the metal layers 202 is separated to form two separated circuit substrates 200c'. It should be noticed that, in FIG. 2J", only one of the circuit substrates 200c' is illustrated. Then, referring to FIG. 2J", a part of the insulating layers 234, the metal layer 202 and the conductive layer 248 are removed to form a plurality of second blind holes V2 exposing the patterned conductive layer 246a. Then, referring to FIG. 2K", two other electroplating seed layers 256 are formed on the insulating layers 212 and 234, one ends of the first blind holes V1 and in the second blind holes V2. Then, referring to FIG. 2L", two other patterned photoresist layers 258 are formed on the electroplating seed layers 256, and the patterned photoresist layers 258 are taken as a mask to electroplate the electroplating seed layers 256 to form a conductive material 249. Finally, referring to FIG. 2M", the patterned photoresist layers 258 and a part of the electroplating seed layers 256 covered by the patterned photoresist layers 258 are removed to from two patterned conductive material layer 249a and a plurality of conductive through hole structures 249b on the insulating layers 212 and 234. The conductive through hole structures 246b and 249b are electrically connected to the patterned conductive layer 246a and the patterned conductive material layers 249a. Now, fabrication of the circuit substrate 200c having three layers of circuit is completed.

It should be noticed that in the above embodiments the circuit substrates 200a, 200b and 200c of three layers of circuit are formed, though other embodiments that are not illustrated, the circuit substrates 200a, 200b and 200c of three layers of circuit can be used as core layers to sequentially fabricate circuit substrates of five layers, seven layers or more than seven layers, and manufacturing methods thereof are the same to the manufacturing method of the general circuit substrate, which can be implemented by those skilled in the art with reference of the aforementioned embodiments by using the aforementioned components according to actual design requirements, so that detailed descriptions thereof are not repeated.

According to the above descriptions, it is known that the odd-numbered layers of the circuits and the even-numbered layers of the circuits can all be fabricated according to the manufacturing methods of the above circuit substrates 100a, 100b, 200a, 200b and 200c, so that not only the circuit substrates 100a, 100b, 200a, 200b and 200c can be manufactured within the same manufacturing time to speed manufacture of the multi-layer circuit substrate, a problem of warping of the circuit substrates 100a, 100b, 200a, 200b and 200c can also be avoided. Moreover, compared to the conventional technique, the manufacturing methods of the circuit substrates 100a, 100b, 200a, 200b and 200c do not require a metal substrate to serve as a support carrier, namely, a coreless circuit substrate is achieved, which may effectively reduce the manufacturing cost of the circuit substrates 100a, 100b, 200a, 200b and 200c and improve reliability thereof, and effectively reduce a time required for manufacturing the circuit substrates 100a, 100b, 200a, 200b and 200c.

It should be noticed that patterns of the metal layers 102 and 202 are not limited by the invention, and although the above metal layers 102 and 202 are respectively embodied by a pattern of a single metal layer, in other embodiments, the metal layers 102 and 202 can also be metal layers formed by multiple layers of copper foil layers, which is still belonged to the technical solutions of the invention without departing from a protection scope of the invention.

Figure 3A:
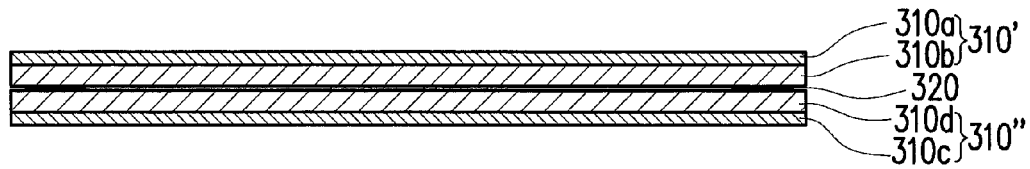
FIG. 3A to FIG. 3P are cross-sectional views illustrating a manufacturing method of a circuit substrate according to another embodiment of the invention.
Figure 3B:
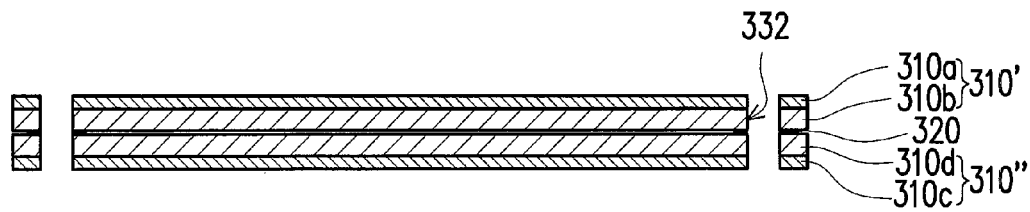
Figure 3C:
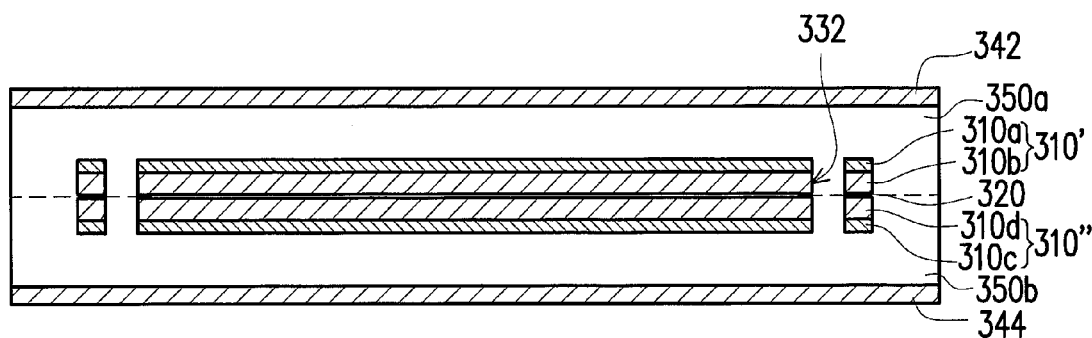
Figure 3D:
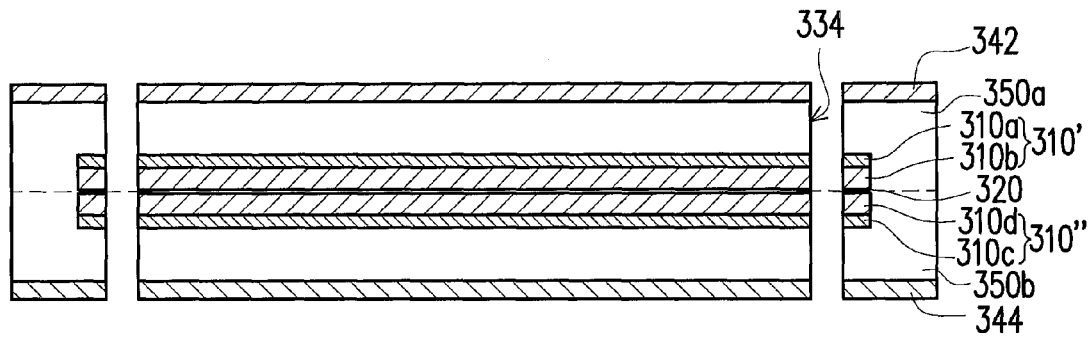
Figure 3E:
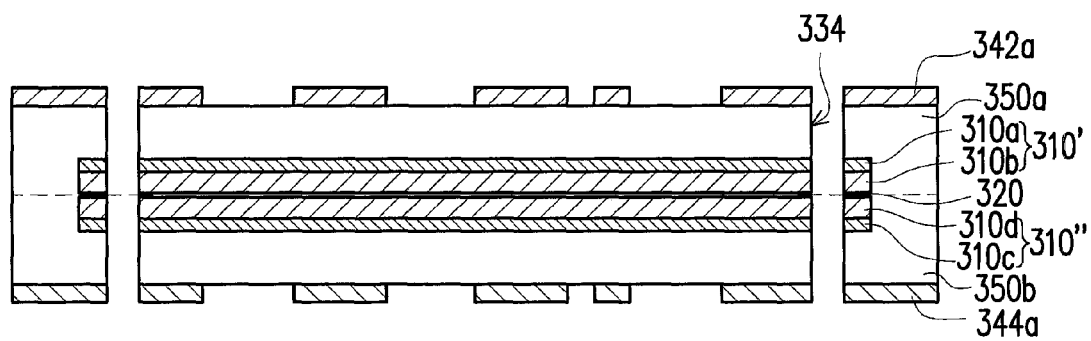
Figure 3F:
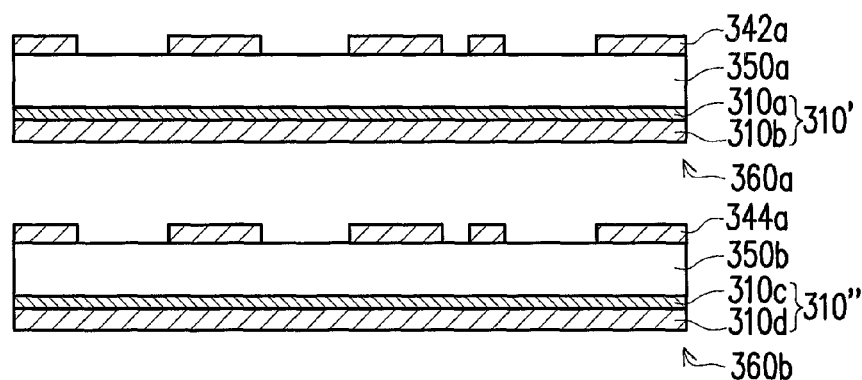
Figure 3G:
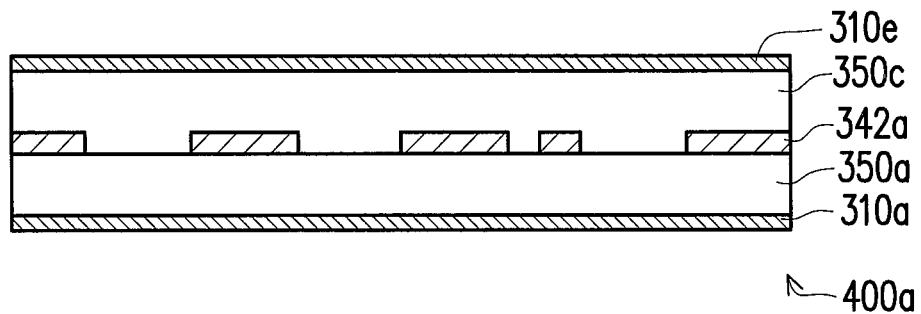
Figure 3H:
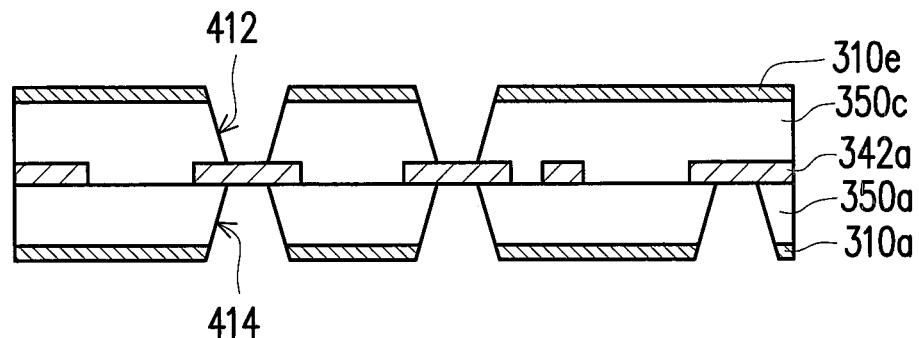
Figure 3I:
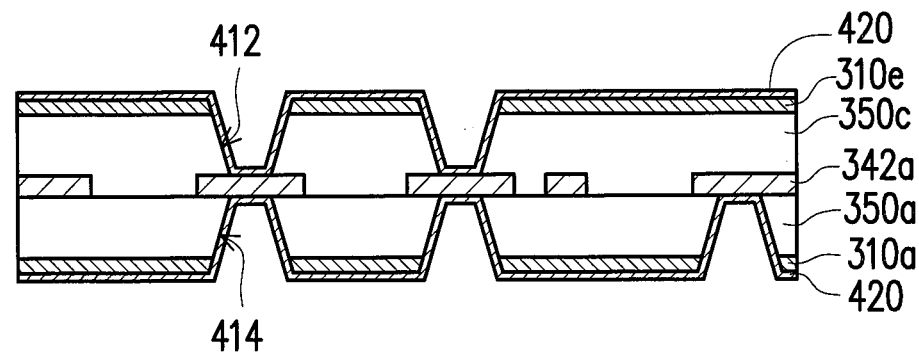
Figure 3J:
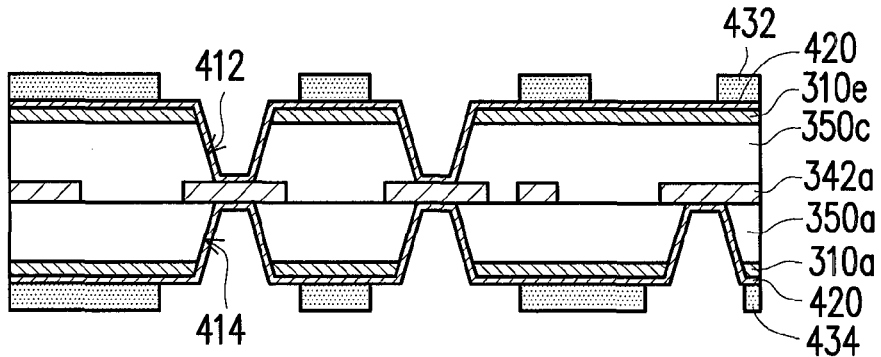
Figure 3K:
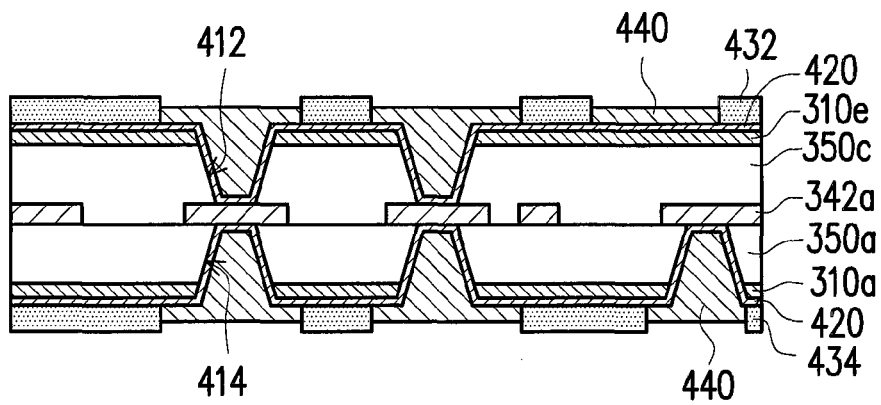
Figure 3L:
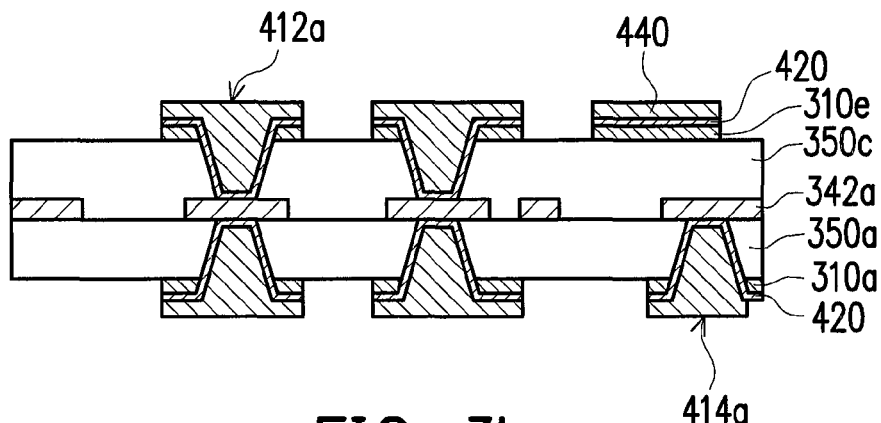
Figure 3M:
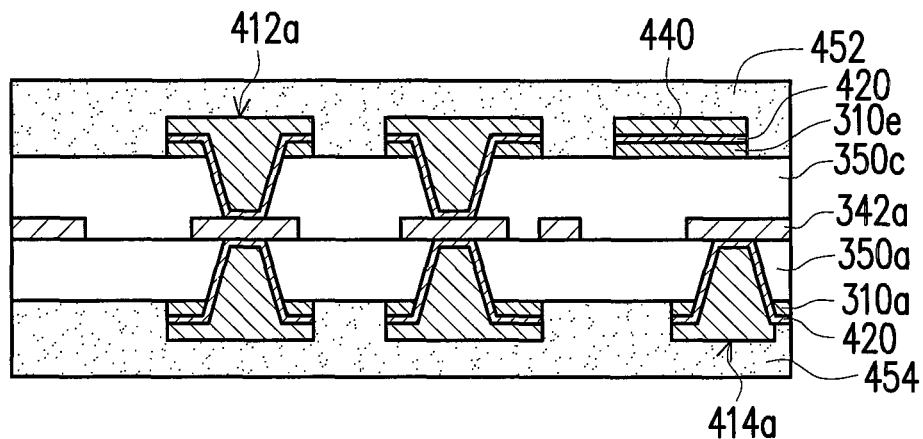
Figure 3N:
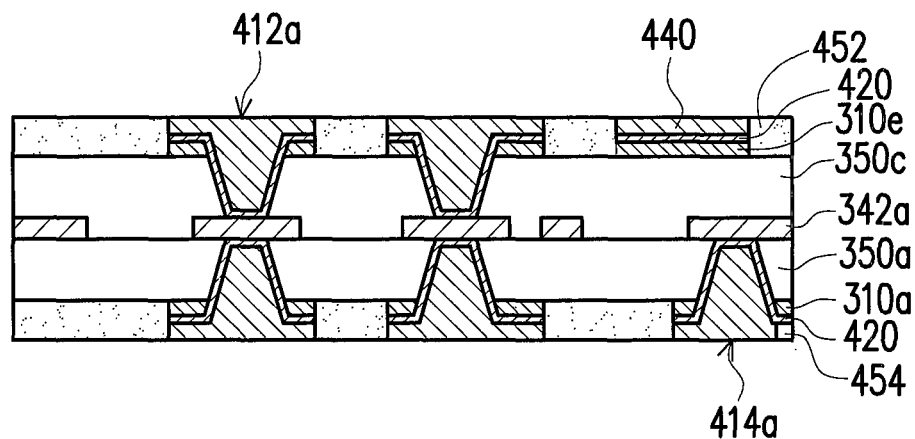
Figure 3O:
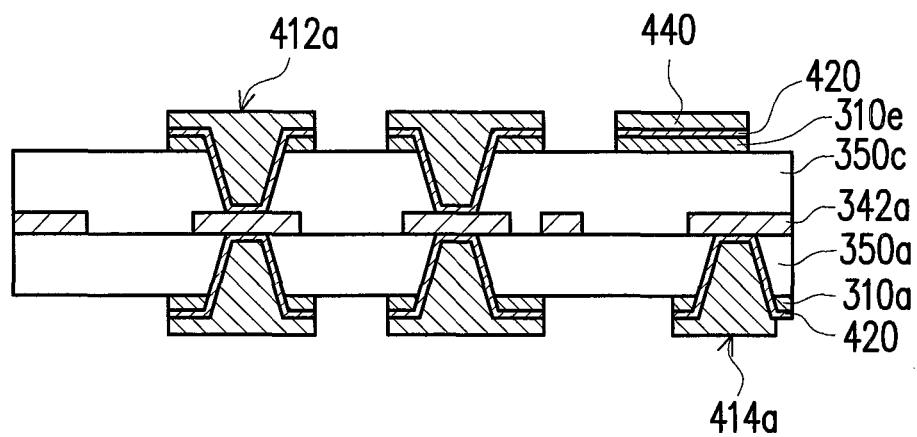
Figure 3P:
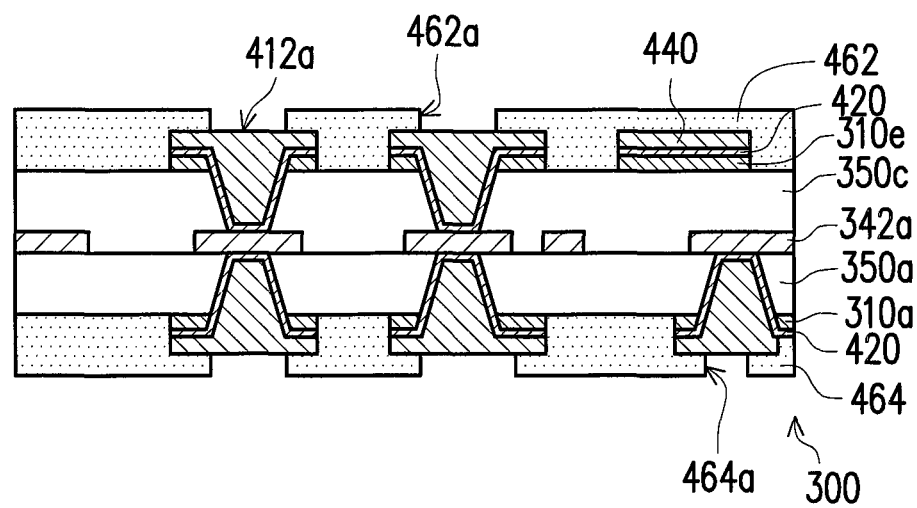

In detail, FIG. 3A to FIG. 3P are cross-sectional views illustrating a manufacturing method of a circuit substrate according to another embodiment of the invention. Referring to FIG. 3A, in the manufacturing method of the circuit substrate, first, two metal layers 310' and 310" are provided, where the metal layer 310' is formed by a first copper foil layer 310a and a second copper foil layer 310b located on the first copper foil layer 310a, and the metal layer 310" is formed by a third copper foil layer 310c and a fourth copper foil layer 310d located on the third copper foil layer 310c. The second copper foil layer 310b is partially bonded to the fourth copper foil layer 310d through an adhesive 320. Namely, the adhesive 320 is located between the second copper foil layer 310b and the fourth copper foil layer 310d, and is partially adhered to the second copper foil layer 310b and the fourth copper foil layer 310d. Moreover, the first copper foil layer 310a and the second copper foil layer 310b thereon can be regarded as a coreless structure layer. Similarly, the third copper foil layer 310c and the fourth copper foil layer 310d thereon can be regarded as a coreless structure layer.

In the present embodiment, a thickness of the second copper foil layer 310b is substantially greater than a thickness of the first copper foil layer 310a, where the thickness of the first copper foil layer 310a is, for example, 3 μm, and the thickness of the second copper foil layer 310b is, for example, 12 μm. The thickness of the first copper foil layer 310a is substantially the same to a thickness of the third copper foil layer 310c, namely, the thickness of the third copper foil layer 310c is also 3 μm. The thickness of the second copper foil layer 310b is substantially the same to a thickness of the fourth copper foil layer 310d, namely, the thickness of the fourth copper foil layer 310d is also 12 μm. The second copper foil layer 310b can be used to support the first copper foil layer 310a. Similarly, the fourth copper foil layer 310d can be used to support the third copper foil layer 310c. Therefore, in the present embodiment, it is unnecessary to use a metal substrate to serve as a support carrier as that does of the conventional technique, so that manufacturing cost can be effectively reduced. Moreover, the adhesive 320 is, for example, cyanoacrylate ester (which is generally referred to as 3 second glue) or polypropylene resin (i.e. PP glue). It should be noticed that in the present embodiment, although the adhesive 320 is used to bond the second copper foil layer 310b and the fourth copper foil layer 310d, in other embodiments that are not illustrated, the second copper foil layer 310b and the fourth copper foil layer 310d can also be bonded by welding copper foil, and now the adhesive 320 is melted copper foil. Here, such bonding method is still belonged to a pattern within the scope of the invention.

Then, referring to FIG. 3B, a plurality of first through holes 332 extending from the first copper foil layer 310a to the third copper foil layer 310c is formed. Namely, the first through holes 332 at least pass through the first copper foil layer 310a, the second copper foil layer 310b, the fourth copper foil layer 310d and the third copper foil layer 310c. In the present embodiment, a method of forming the first through holes 332 includes mechanical drilling.

Then, referring to FIG. 3C, a first insulating layer 350a and a first conductive layer 342 located on the first insulating layer 350a are laminated to the first copper foil layer 310a, and meanwhile a second insulating layer 350b and a second conductive layer 344 located on the second insulating layer 350b are laminated to the third copper foil layer 310c. In the present embodiment, the first insulating layer 350a and the second insulating layer 350b respectively face to the first copper foil layer 310a and the third copper foil layer 310c, and during the lamination, a part of the first insulating layer 350a and a part of the second insulating layer 350b are filled in the first through holes 332 to fill up the first through holes 332. Moreover, a material of the first conductive layer 342 and the second conductive layer 344 is, for example, copper.

Particularly, in the present embodiment, a thickness of the first insulating layer 350a plus a thickness of the first conductive layer 342 is greater than the thickness of the first copper foil layer 310a plus the thickness of the second copper foil layer 310b. The thickness of the first insulating layer 350a is, for example, 40 μm, and the thickness of the first conductive layer 342 is, for example, 18 μm. Similarly, a thickness of the second insulating layer 350b plus a thickness of the second conductive layer 344 is greater than the thickness of the third copper foil layer 310c plus the thickness of the fourth copper foil layer 310d. The thickness of the second insulating layer 350b is substantially the same to that of the first insulating layer 350a, which is, for example, 40 μm, and the thickness of the second conductive layer 344 is substantially the same to that of the first conductive layer 342, which is, for example, 18 μm.

Then, referring to FIG. 3D, a plurality of second through holes 334 extending from the first conductive layer 342 to the second conductive layer 344 is formed, where the second through holes 334 at least pass through the first conductive layer 342, the first insulating layer 350a, the first copper foil layer 310a, the second copper foil layer 310b, the fourth copper foil layer 310d, the third copper foil layer 310c, the second insulating layer 350b and the second conductive layer 344. Moreover, the second through holes 334 can be used to assist removing the adhesive 320 in a follow-up process, namely, removing a bonding area of the second copper foil layer 310b and the fourth copper foil layer 310d. Generally, the first conductive layer 342 and the second conductive layer 344 may respectively have a plurality of metal patterns (not shown), and the metal patterns can serve as reference points for positioning and alignment in follow-up processes. Namely, the metal patterns of the first conductive layer 342 and the second conductive layer 344 can serve as a reference for positioning and aligning the first copper foil layer 310a and the third copper foil layer 310c, and can serve as a reference for positioning and aligning a fifth copper foil layer 310e (shown in FIG. 3G).

Then, referring to FIG. 3E, the first conductive layer 342 and the second conductive layer 344 are patterned to form a first circuit layer 342a and a second circuit layer 344a, where a method for patterning the first conductive layer 342 and the second conductive layer 344 includes a photolithography etching process. Particularly, since the first conductive layer 342 and the second conductive layer 344 are respectively laminated to the first insulating layer 350a and the second insulating layer 350b, and are patterned to form the first circuit layer 342a and the second circuit layer 344a, compared to the conventional technique of forming a circuit layer through electroplating, the first circuit layer 342a and the second circuit layer 344a of the present embodiment has better copper thickness evenness. Moreover, since the first copper foil layer 310a, the second copper foil layer 310b, the third copper foil layer 310c and the fourth copper foil layer 310d of the present embodiment are all embedded in the first insulating layer 350a and the second insulating layer 350b due to thermal lamination, when the first conductive layer 342 and the second conductive layer 344 are patterned, contaminations of external impurities and reagents can be avoided, so as to maintain sizes and thickness of the first copper foil layer 310a, the second copper foil layer 310b, the third copper foil layer 310c and the fourth copper foil layer 310d.

Then, referring to FIG. 3F, the adhesive 320 is removed to form a first circuit substrate 360a and a second circuit substrate 360b separated from each other. In the present embodiment, the second through holes 334 can be used to assist removing the adhesive 320. Namely, by forming the second through holes 334, adhesion between the adhesive 320 and the second copper foil layer 310b and the fourth copper foil layer 310d can be spoiled, so as to easily remove the adhesive 320. Moreover, a method of removing the adhesive 320 is, for example, mechanical drilling or milling treatment. It should be noticed that in the present embodiment, since the adhesive 320 is partially bonded between the second copper foil layer 310b and the fourth copper foil layer 310d, compared to the conventional technique of removing a large amount of adhesive between a circuit layer and a metal substrate, the step of removing the adhesive 320 of the present embodiment is simple and has a low difficulty, so that a production yield can be improved.

In the present embodiment, the first circuit substrate 360a and the second circuit substrate 360b formed after the adhesive 320 is removed are symmetric structures. The first circuit substrate 360a sequentially includes the first circuit layer 342a, the first insulating layer 350a, the first copper foil layer 310a and the second copper foil layer 310b. The second circuit substrate 360b sequentially includes the second circuit layer 344a, the second insulating layer 350b, the third copper foil layer 310c and the fourth copper foil layer 310d. For simplicity's sake, only the first circuit substrate 360a is taken as an example to describe follow-up fabrication processes of the circuit substrate.

Referring to FIG. 3G, the second copper foil layer 310b is removed, and a third insulating layer 350c and the fifth copper foil layer 310e on the third insulating layer 350c are laminated to the first circuit layer 342a. In the present embodiment, a method of removing the second copper foil layer 310b is, for example, a lift-off method, namely, the lift-off method is used to peel off the second copper foil layer 310b from the first copper foil layer 310a. Moreover, the third insulating layer 350c and the fifth copper foil layer 310e are laminated to the first circuit layer 342a, so that the first circuit layer 342a is changed to an internal circuit layer. Namely, the first circuit layer 342a is embedded between the third insulating layer 350c and the first insulating layer 350a. In addition, the fifth copper foil layer 310e is laminated to the first circuit layer 342a with a reference of the metal patterns (not shown) on the first circuit layer 342a (the original first conductive layer 342), so as to ensure that the first copper foil layer 310a, the first circuit layer 342a and the fifth copper foil layer 310e have a better alignment accuracy.

Generally, a thickness of the fifth copper foil layer 310e is relatively thin, which is, for example, 3 µm, so that when the fifth copper foil layer 310e is to be laminated, a copper foil layer with relatively thick thickness (not shown) is generally added on the fifth copper foil layer 310e first, where the thickness thereof is, for example, 12 µm, so as to prevent a bending phenomenon of the fifth copper foil layer 310e after the lamination, and maintain a surface flatness of the fifth copper foil layer 310e. Then, after the lamination, the copper foil layer with the relatively thick thickness is peeled off, and the fifth copper foil layer 310e with the relatively thin thickness is remained for follow-up processes.

In brief, the third insulating layer 350c and the fifth copper foil layer 310e located on the third insulating layer 350c are laminated to the first circuit layer 342a after the adhesive 320 is removed. However, a sequence of the steps of laminating the third insulating layer 350c and the fifth copper foil layer 310e located thereon and removing the adhesive 320 is not limited by the invention. In other embodiments, the third insulating layer 350c and the fifth copper foil layer 310e located on the third insulating layer 350c can be laminated to the first circuit layer 342a before the adhesive 320 is removed.

Figure 4A:
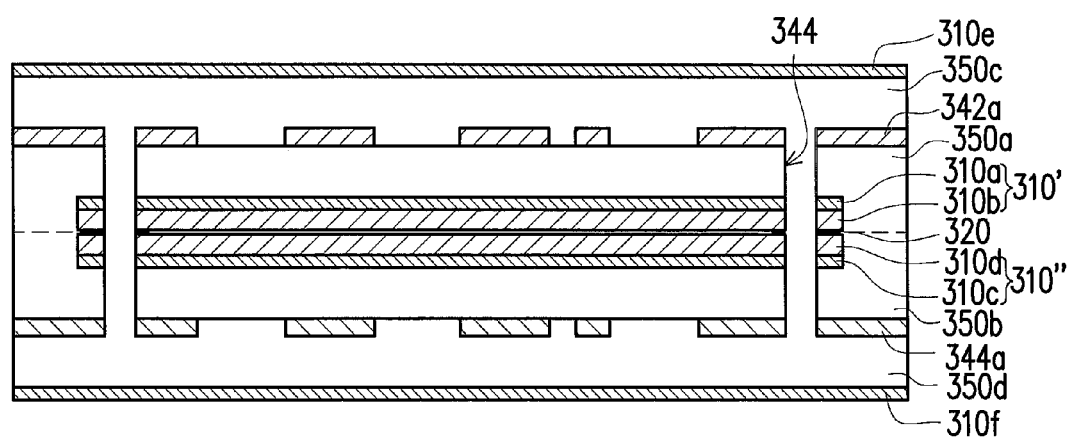
FIG. 4A and FIG. 4B are cross-sectional views illustrating a manufacturing method of a circuit substrate according to another embodiment of the invention.
Figure 4B:
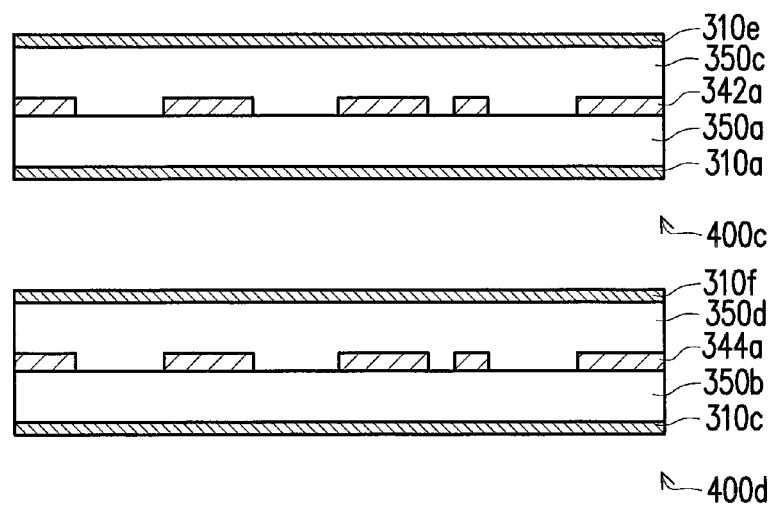

In detail, referring to FIG. 4A, the third insulating layer 350c and the fifth copper foil layer 310e located on the third insulating layer 350c are first laminated to the first circuit layer 342a, and meanwhile a fourth insulating layer 350d and a sixth copper foil layer 310f located on the fourth insulating layer 350d are laminated to the second circuit layer 344a. Then, as shown in FIG. 4B, the adhesive 320, the second copper foil layer 310b and the fourth copper foil layer 310d are removed to form a third circuit substrate 400c and a fourth circuit substrate 400d separated from each other. The third circuit substrate 400c and the fourth circuit substrate 400d formed after the adhesive 320, the second copper foil layer 310b and the fourth copper foil layer 310d are removed are symmetric structures, where the third circuit substrate 400c sequentially includes the fifth copper foil layer 310e, the third insulating layer 350c, the first circuit layer 342a, the first insulating layer 350a and the first copper foil layer 310a. Similarly, the fourth circuit substrate 400d sequentially includes the sixth copper foil layer 310f, the fourth insulating layer 350d, the second circuit layer 344a, the second insulating layer 350b and the third copper foil layer 310c. In other words, the sequence of the steps of laminating the insulating layer and the copper foil layer located thereon to the circuit layer and removing the adhesive 320 can be selectively adjusted according to an actual requirement, so that the steps shown in FIG. 3F to FIG. 3G are only used as an example, and the invention is not limited thereto.

Now, the fabrication of the first circuit substrate 400a is completed, where the first circuit substrate 400a sequentially includes the fifth copper foil layer 310e, the third insulating layer 350c, the first circuit layer 342a, the first insulating layer 350a and the first copper foil layer 310a.

Then, referring to FIG. 3H, a drilling process is performed to the fifth copper foil layer 310e and the first copper foil layer 310a to form a plurality of first blind holes 412 extending from the fifth copper foil layer 310e to the first circuit layer 342a and a plurality of second blind holes 414 extending from the first copper foil layer 310a to the first circuit layer 342a, where the first blind holes 412 and the second blind holes 414 expose a part of the first circuit layer 342a. In the present embodiment, the drilling process is, for example, the laser drilling, namely, the first blind holes 412 and the second blind holes 414 are formed through laser ablation.

Then, referring to FIG. 3I, a chemical copper layer 420 is formed in the first blind holes 412 and the second blind holes 414, where the chemical copper layer 420 is connected to the fifth copper foil layer 310e and the first circuit layer 342a and connected to the first copper foil layer 310a and the first circuit layer 342a. In detail, in the present embodiment, the chemical copper layer 420 covers the fifth copper foil layer 310e, the first blind holes 412, the first copper foil layer 310a and the second blind holes 414, and the fifth copper foil layer 310e is electrically connected to the first circuit layer 342a through the chemical copper layer 420, and the first copper foil layer 310a is electrically connected to the first circuit layer 342a through the chemical copper layer 420. Moreover, a method of forming the chemical copper layer 420 includes an electroless plating process.

Then, referring to FIG. 3J, a first patterned dry film photoresist layer 432 is formed on the fifth copper foil layer 310e, and a second patterned dry film photoresist layer 434 is formed on the first copper foil layer 310a, where the first patterned dry film photoresist layer 432 at least exposes the first blind holes 412, and the second patterned dry film photoresist layer 434 at least exposes the second blind holes 414. In detail, in the present embodiment, the first patterned dry film photoresist layer 432 exposes the chemical copper layer 420 located in the first blind holes 412 and the chemical copper layer 420 located on a part of the fifth copper foil layer 310e. The second patterned dry film photoresist layer 434 exposes the chemical copper layer 420 located in the second blind holes 414 and the chemical copper layer 420 located on a part of the first copper foil layer 310a.

Then, referring to FIG. 3K, an electroplating copper layer 440 is formed in at least the first blind holes 412 and the second blind holes 414, where the electroplating copper layer 440 fills up the first blind holes 412 and the second blind holes 414, and covers a part of the chemical copper layer 420. In the present embodiment, by using the first patterned dry film photoresist layer 432 and the second patterned dry film photoresist layer 434 as masks for electroplating, the electroplating copper layer 440 is formed in the first blind holes 412, the second blind holes 414 and on the chemical copper layers 420 that are not covered by the first patterned dry film photoresist layer 432 and the second patterned dry film photoresist layer 434 through a via filling plating method.

Then, referring to FIG. 3L, the first patterned dry film photoresist layer 432 and a part of the chemical copper layer 420 and a part of the fifth copper foil layer 310e located under the first patterned dry film photoresist layer 432 are removed, and the second patterned dry film photoresist layer 434 and a part of the chemical copper layer 420 and a part of the first copper foil layer 310a located under the second patterned dry film photoresist layer 434 are removed, so as to expose a part of the third insulating layer 350c and a part of the first insulating layer 350a, and form first conductive blind hole structures 412a in the first blind holes 412 and form second conductive blind hole structures 414a in the second blind holes 414. In the present embodiment, a method of removing the first patterned dry film photoresist layer 432 and a part of the chemical copper layer 420 and a part of the fifth copper foil layer 310e located under the first patterned dry film photoresist layer 432 and removing the second patterned dry film photoresist layer 434 and a part of the chemical copper layer 420 and a part of the first copper foil layer 310a located under the second patterned dry film photoresist layer 434 includes an etching process. Now, the first conductive blind hole structures 412a and the second conductive blind hole structures 414a electrically connected to the first circuit layer 342a are formed.

Then, referring to FIG. 3M, a first passivation layer 452 is formed on the third insulating layer 350c, and a second passivation layer 454 is formed on the first insulating layer 350a. In the present embodiment, the first passivation layer 452 covers the third insulating layer 350c and the first conductive blind hole structures 412a exposed on the third insulating layer 350c for protecting pattern integrity of the first conductive blind hole structures 412a. Similarly, the second passivation layer 454 covers the first insulating layer 350a and the second conductive blind hole structures 414a exposed on the first insulating layer 350a for protecting pattern integrity of the second conductive blind hole structures 414a. Moreover, a method of forming the first passivation layer 452 and the second passivation layer 454 is, for example, screen printing, and a material of the first passivation layer 452 and the second passivation layer 454 is, for example, ink.

Then, referring to FIG. 3N, a grinding process is performed to remove a part of the first passivation layer 452 to expose surfaces of the first conductive blind hole structures 412a and remove a part of the second passivation layer 454 to expose surfaces of the second conductive blind hole structures 414a. Now, a surface of the first passivation layer 452 is substantially aligned to the surfaces of the first conductive blind hole structures 412a, and a surface of the second passivation layer 454 is substantially aligned to the surfaces of the second conductive blind hole structures 414a.

Then, referring to FIG. 3O, the remained first passivation layer 452 and the second passivation layer 454 are removed to expose a part of the third insulating layer 350c, the first conductive blind hole structures 412a exposed on the third insulating layer 350c, a part of the first insulating layer 350a and the second conductive blind hole structures 414a exposed on the first insulating layer 350a. In the present embodiment, a purpose of the sequential steps of forming the first passivation layer 452 and the second passivation layer 454, performing the grinding process and removing the first passivation layer 452 and the second passivation layer 454 is to obtain better surface flatness of the surfaces of the first conductive blind hole structures 412a and the surfaces of the second conductive blind hole structures 414a, so as to facilitate follow-up processes and a chip packaging process.

Then, referring to FIG. 3P, a first solder mask layer 462 is formed on the third insulating layer 350c, and a second solder mask layer 464 is formed on the first insulating layer 350a. In the present embodiment, the first solder mask layer 462 has a plurality of first openings 462a, where the first openings 462a expose a part of the first conductive blind hole structures 412a, which can be used as bonding pads. The second solder mask layer 464 has a plurality of second openings 464a, where the second openings 462a expose a part of the second conductive blind hole structures 414a, which can be used as bonding pads. Now, fabrication of a circuit substrate 300 is completed.

Since a part of the first conductive blind hole structures 412a exposed by the first openings 462a of the first solder mask layer 462 can be used as the bonding pads, and a part of the second conductive blind hole structures 414a exposed by the second openings 464a of the second solder mask layer 464 can be used as the bonding pads, when a chip (not shown) is electrically connected to the bonding pads through a wire bonding manner or a flip chip bonding manner, and after a colloid filling mold is used to encapsulate the chip in a colloid (not shown), the chip packaging process is completed. In other words, the circuit substrate 300 of the present embodiment is adapted to serve as a chip packaging carrier.

In brief, in the present embodiment, since it is unnecessary to use a metal substrate to support the first copper foil layer 310a and the second copper foil layer 310c, compared to the conventional technique, the manufacturing method of the circuit substrate 300 of the present embodiment can effectively reduce the fabrication cost. Moreover, since the first conductive layer 342 and the second conductive layer 344 are laminated, and are patterned to form the first circuit layer 342a and the second circuit layer 344a, compared to the conventional technique of forming a circuit layer through electroplating, the first circuit layer 342a and the second circuit layer 344a of the present embodiment has better copper thickness evenness. In addition, the first circuit layer 342a (the original first conductive layer 342) is used as a reference for positioning and aligning the first copper foil layer 310a and the fifth copper foil layer 310e. In this way, alignment accuracy of the circuit substrate 300 can be effectively improved, so as to achieve better production yield and reliability of the circuit substrate 300.

In summary, in the invention, the peripheries of two metal layers are first bonded to form a sealed area. After lamination of two insulating layers and two conductive layers is completed, the two metal layers are separated. Therefore, compared to the conventional technique, the manufacturing method of the circuit substrate of the invention does not require a metal substrate to serve as a support carrier, namely, a coreless circuit substrate is achieved, which may effectively reduce the manufacturing cost of the circuit substrate and improve reliability thereof, and effectively reduce a time required for manufacturing the circuit substrate. Moreover, in the invention, it is unnecessary to use a large amount of adhesive to fix a metal substrate and a circuit layer as that does of the conventional technique, so that the manufacturing method of the circuit substrate of the invention does not have a problems of removing the large amount of adhesive, so that fabrication difficulty and fabrication steps can be effectively reduced. Moreover, in the invention, the conductive layers can be laminated, and then the conductive layers can be patterned to form the circuit layers.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a circuit substrate, comprising:
    bonding peripheries of two metal layers to form a sealed area, wherein each of the two metal layers comprises a first copper foil layer and a second copper foil layer, and a thickness of each of the second copper foil layers is substantially greater than a thickness of each of the first copper foil layers, and the second copper foil layers are bonded to each other;
    forming at least a through hole passing through the sealed area;
    forming two insulating layers on the two metal layers, and forming two conductive layers on the two insulating layers;
    laminating the two insulating layers and the two conductive layers to the two metal layers, wherein the two metal layers bonded to each other are embedded between the two insulating layers, and the two insulating layers are filled into the through hole;
    separating the sealed area of the two metal layers to form two separated circuit substrates; and
    removing the second copper foil layers from each of the two separated circuits by a lift-off method, wherein the lift-off method comprises peeling off the second copper foil layer from the first copper foil layer.

2. The manufacturing method of the circuit substrate as claimed in claim 1, wherein a method of bonding the peripheries of the two metal layers comprises welding, spot welding or using an adhesive, and a material of the adhesive comprises cyanoacrylate ester or polypropylene resin.

3. The manufacturing method of the circuit substrate as claimed in claim 1, further comprising:
    patterning the two conductive layers after laminating the two insulating layers and the two conductive layers to the two metal layers, so as to from a first patterned conductive layer and a second patterned conductive layer;
    forming a plurality of first through holes extending from the first patterned conductive layer to the second patterned conductive layer;
    forming a first insulating layer on the first patterned conductive layer, and forming a first conductive layer on the first insulating layer;
    laminating the first insulating layer and the first conductive layer, wherein the first patterned conductive layer is embedded in the insulating layer and the first insulating layer;
    removing a part of the insulating layer, the first insulating layer, a part of the first copper foil layer and a part of the first conductive layer to fonn a plurality of first blind holes exposing the first patterned conductive layer;

respectively forming an electroplating seed layer on the remained first copper foil layer and in the first blind holes and on the remained first conductive layer and in the first blind holes;

forming two patterned photoresist layers on the electroplating seed layers;

taking the patterned photoresist layers as a mask to electroplate the electroplating seed layers to form a plurality of conductive blind hole structures in the first blind holes; and removing the patterned photoresist layers and a part of the electroplating seed layers covered by the patterned photoresist layers.

4. The manufacturing method of the circuit substrate as claimed in claim 3, wherein the step of forming the first insulating layer on the first patterned conductive layer and forming the first conductive layer on the first insulating layer is performed after the sealed area of the two metal layers is separated.

5. The manufacturing method of the circuit substrate as claimed in claim 3, wherein the step of foiiiiing the first insulating layer on the first patterned conductive layer and forming the first conductive layer on the first insulating layer is performed before the sealed area of the two metal layers is separated.

6. The manufacturing method of the circuit substrate as claimed in claim 5, further comprising:

forming a second insulating layer on the second patterned conductive layer and forming a second conductive layer on the second insulating layer when forming the first insulating layer on the first patterned conductive layer and forming the first conductive layer on the first insulating layer.

7. The manufacturing method of the circuit substrate as claimed in claim 3, further comprising:

forming a first passivation layer on the first insulating layer and forming a second passivation layer on the insulating layer after removing the patterned photoresist layers and a part of the electroplating seed layers covered by the patterned photoresist layers, wherein the first passivation layer and the second passivation layer cover the conductive blind hole structures;

performing a grinding process to remove a part of the first passivation layer and a part of the second passivation layer to expose the conductive blind hole structures; and removing the remained first passivation layer and the remained second passivation layer.

8. The manufacturing method of the circuit substrate as claimed in claim 3, further comprising:

forming a first solder mask layer on the first insulating layer and forming a second solder mask layer on the insulating layer after removing the patterned photoresist layers and a part of the electroplating seed layers covered by the patterned photoresist layers, wherein the first solder mask layer has a plurality of first openings, and the second solder mask layer has a plurality of second openings, and the first openings and the second openings expose a part of the conductive blind hole structure.

* * * * *